US012671059B2

(12) United States Patent
Decker et al.

(10) Patent No.: US 12,671,059 B2
(45) Date of Patent: Jun. 30, 2026

(54) RF IMPEDANCE MATCHING NETWORK WITH SERIES-CONNECTED DIODE SWITCHES

(71) Applicant: ASM America, Inc., Pheonix, AZ (US)

(72) Inventors: Ronald Anthony Decker, Turnersville, NJ (US); Imran Ahmed Bhutta, Morrestown, NJ (US)

(73) Assignee: ASM America, Inc.

( * ) Notice: Subject to any disclaimer, the term of this patent is extended or adjusted under 35 U.S.C. 154(b) by 252 days.

(21) Appl. No.: 18/563,089

(22) PCT Filed: May 25, 2022

(86) PCT No.: PCT/US2022/030796
§ 371 (c)(1),
(2) Date: Nov. 21, 2023

(87) PCT Pub. No.: WO2022/251269
PCT Pub. Date: Dec. 1, 2022

(65) Prior Publication Data
US 2024/0234095 A1      Jul. 11, 2024

Related U.S. Application Data

(60) Provisional application No. 63/193,183, filed on May 26, 2021.

(51) Int. Cl.
*H01J 37/32* (2006.01)
*H03H 7/40* (2006.01)
*H03K 17/74* (2006.01)

(52) U.S. Cl.
CPC ......... *H01J 37/32183* (2013.01); *H03H 7/40* (2013.01); *H03K 17/74* (2013.01)

(58) Field of Classification Search
CPC ...... H01J 37/32183; H03H 7/40; H03K 17/74
See application file for complete search history.

(56) References Cited

U.S. PATENT DOCUMENTS

| | | | |
|---|---|---|---|
| 10,431,428 B2 | 10/2019 | Bhutta et al. | |
| 10,963,655 B1 | 3/2021 | Lavedas et al. | |

(Continued)

FOREIGN PATENT DOCUMENTS

| | | |
|---|---|---|
| JP | S57194629 A | 11/1982 |
| JP | 2009238804 A | 10/2009 |

(Continued)

OTHER PUBLICATIONS

International Search Report issued in PCT/US2022/030796.

*Primary Examiner* — Samuel S Outten
(74) *Attorney, Agent, or Firm* — The Belles Group, P.C. (ASM)

(57) ABSTRACT

In one embodiment, an RF impedance matching circuit is disclosed. The matching circuit includes at least one electronically variable capacitor (EVC). Each EVC includes fixed capacitors, each of the fixed capacitors having a corresponding switching circuit for switching in and out the fixed capacitor to alter a total capacitance of the EVC. Each switching circuit includes a switch operably coupled to the fixed capacitor to cause the switching in and out of the fixed capacitor. The switch includes at least one string of series-connected PIN or NIP diodes. For each string, at least one of the diodes of the string has a balancing capacitor parallel to the diode.

17 Claims, 15 Drawing Sheets

(56)             References Cited

U.S. PATENT DOCUMENTS

| | | |
|---|---|---|
| 2006/0198077 A1 | 9/2006 | Bhutta |
| 2011/0001542 A1 | 1/2011 | Ranta et al. |
| 2016/0064161 A1 | 3/2016 | Bhutta |
| 2017/0178865 A1 | 6/2017 | Ulrich |
| 2017/0301516 A1 | 10/2017 | Bhutta et al. |
| 2018/0041183 A1 | 2/2018 | Mavretic et al. |
| 2019/0013185 A1 | 1/2019 | Bhutta et al. |
| 2019/0172683 A1* | 6/2019 | Mavretic ............. H03K 17/691 |
| 2019/0272978 A1 | 9/2019 | Bhutta et al. |
| 2020/0335307 A1 | 10/2020 | Bhutta et al. |
| 2020/0411285 A1 | 12/2020 | Mavretic |
| 2021/0183623 A1 | 6/2021 | Bhutta |
| 2021/0327684 A1 | 10/2021 | Bhutta |

FOREIGN PATENT DOCUMENTS

| | | |
|---|---|---|
| JP | 2011515832 A | 5/2011 |
| JP | 2017069823 A | 4/2017 |
| TW | 201929030 A | 7/2019 |
| TW | 202005480 A | 1/2020 |

* cited by examiner

85

86

RF IMPEDANCE MATCHING NETWORK WITH SERIES-CONNECTED DIODE SWITCHES

CROSS REFERENCE TO RELATED APPLICATIONS

The present application is a U.S. national stage application under 35 U.S.C. § 371 of PCT Application No. PCT/US22/30796, filed May 25, 2022, which claims the benefit of U.S. Provisional Patent Application No. 63/193,183, filed May 26, 2021. The disclosures of the aforementioned priority applications are incorporated herein by reference in their entireties.

BACKGROUND

In making semiconductor devices such as microprocessors, memory chips, and another integrated circuits, the semiconductor device fabrication process uses plasma processing at different stages of fabrication. Plasma processing involves energizing a gas mixture by imparting energy to the gas molecules by the introduction of RF (radio frequency) energy into the gas mixture. This gas mixture is typically contained in a vacuum chamber, also called a plasma chamber, and the RF energy is introduced through electrodes or other means in the chamber. In a typical plasma process, the RF generator generates power at the desired RF frequency and power, and this power is transmitted through the RF cables and networks to the plasma chamber.

To provide efficient transfer of power from the RF generator to the plasma chamber, an RF matching network is positioned between the RF generator and the plasma chamber. The purpose of the RF matching network is to transform the plasma impedance to a value suitable for the RF generator. In many cases, particularly in the semiconductor fabrication processes, the RF power is transmitted through 50 Ohm coaxial cables and the system impedance (output impedance) of the RF generators is also 50 Ohm. On the other hand, the impedance of the plasma, driven by the RF power, varies based on the plasma chemistry and other conditions inside the plasma chamber. This impedance must be transformed to non-reactive 50 Ohm (i.e., 50+j0) for maximum power transmission. RF matching network performs this task of continuously transforming the plasma impedance to 50 Ohm for the RF generator. In most cases, this transformation is done such that the impedance on the input side of the RF matching network becomes 50+j0 Ohm, that is, a purely resistive 50 Ohm.

An RF matching network may comprise variable capacitors and a microprocessor-based control circuit to control the capacitors. The value and size of the variable capacitors are influenced by the power handling capability, frequency of operation, and impedance range of the plasma chamber. The predominant variable capacitor in use in RF matching networks is the vacuum variable capacitor (VVC). The VVC is an electromechanical device, consisting of two concentric metallic rings that move in relation to each other to change the capacitance. In complex semiconductor processes, where the impedance changes are very rapid, the rapid and frequent movements put stresses on the VVC leading to their failures. VVC-based RF matching networks are one of the last electromechanical components in the semiconductor fabrication process.

As semiconductor devices shrink in size and become more complex, however, the feature geometries become very small. As a result, the processing time to fabricate these features becomes small, typically in the 5-6 second range. Current RF matching networks take 1-2 seconds to tune the process and this results in unstable process parameters for a significant portion of the process time. Electronically variable capacitor (EVC) technology (see, e.g., U.S. Pat. No. 7,251,121, incorporated herein by reference in its entirety) enables a reduction in this semiconductor processing tune time from 1-2 seconds to less than 500 microseconds. EVC-based matching networks are a type of solid state matching network. Their decreased tune time greatly increases the available stable processing time, thereby improving yield and performance.

While EVC technology is known, it has yet to be developed into an industry-accepted replacement for VVCs. Because an EVC is purely an electronic device, an EVC is not a one-for-one replacement for a VVC in an RF matching network. Further advancements are therefore needed to more fully take advantage of using EVCs as part of an RF matching network.

BRIEF SUMMARY

The present disclosure may be directed to a radio frequency (RF) impedance matching circuit, the matching circuit comprising an RF input configured to operably couple to an RF source providing an RF signal; an RF output configured to operably couple to a plasma chamber; at least one electronically variable capacitor (EVC), wherein each EVC of the at least one EVC comprises fixed capacitors, each of the fixed capacitors having a corresponding switching circuit for switching in and out the fixed capacitor to alter a total capacitance of the EVC; and a control circuit configured to cause the switching in and out of the fixed capacitors of each EVC to enable an impedance match; wherein each switching circuit for each fixed capacitor of each EVC comprises a switch operably coupled to the fixed capacitor to cause the switching in and out of the fixed capacitor, the switch comprising at least one string of series-connected diodes, each of the diodes of the series-connected diodes being a PIN diode or an NIP diode; wherein, for each of the at least one string, at least one of the diodes of the string having a balancing capacitor parallel to the diode.

In another aspect, a method of matching an impedance includes coupling a radio frequency (RF) input of a matching circuit to an RF source providing an RF signal; coupling an RF output of the matching circuit to a plasma chamber, wherein the matching circuit comprises at least one electronically variable capacitor (EVC), wherein each EVC of the at least one EVC comprises fixed capacitors, each of the fixed capacitors having a corresponding switching circuit for switching in and out the fixed capacitor to alter a total capacitance of the EVC; and a control circuit configured to cause the switching in and out of the fixed capacitors of each EVC to enable an impedance match; wherein each switching circuit for each fixed capacitor of each EVC comprises a switch operably coupled to the fixed capacitor to cause the switching in and out of the fixed capacitor, the switch comprising at least one string of series-connected diodes, each of the diodes of the series-connected diodes being a PIN diode or an NIP diode; wherein, for each of the at least one string, at least one of the diodes of the string having a balancing capacitor parallel to the diode; and matching an impedance by at least one of the switching circuits of the at least one EVC switching in or out its corresponding fixed capacitor to alter a total capacitance of the EVC.

In another aspect, a semiconductor processing tool includes a plasma chamber configured to deposit a material onto a substrate or etch a material from the substrate; and an impedance matching circuit operably coupled to the plasma chamber, the matching circuit comprising an RF input configured to operably couple to an RF source providing an RF signal; an RF output configured to operably couple to the plasma chamber; at least one electronically variable capacitor (EVC), wherein each EVC of the at least one EVC comprises fixed capacitors, each of the fixed capacitors having a corresponding switching circuit for switching in and out the fixed capacitor to alter a total capacitance of the EVC; and a control circuit configured to cause the switching in and out of the fixed capacitors of each EVC to enable an impedance match; wherein each switching circuit for each fixed capacitor of each EVC comprises a switch operably coupled to the fixed capacitor to cause the switching in and out of the fixed capacitor, the switch comprising at least one string of series-connected diodes, each of the diodes of the series-connected diodes being a PIN diode or an NIP diode; wherein, for each of the at least one string, at least one of the diodes of the string having a balancing capacitor parallel to the diode.

In another aspect, a method of fabricating a semiconductor includes placing a substrate in a plasma chamber configured to deposit a material layer on the substrate or etch a material layer from the substrate; energizing plasma within the plasma chamber by coupling RF power from an RF source to the plasma chamber to perform the deposition or etching; and while energizing the plasma, carrying out an impedance match by an impedance matching circuit coupled between the plasma chamber and the RF source, the matching circuit comprising an RF input configured to operably couple to the RF source; an RF output configured to operably couple to the plasma chamber; at least one electronically variable capacitor (EVC), wherein each EVC of the at least one EVC comprises fixed capacitors, each of the fixed capacitors having a corresponding switching circuit for switching in and out the fixed capacitor to alter a total capacitance of the EVC; and a control circuit configured to cause the switching in and out of the fixed capacitors of each EVC to enable an impedance match; wherein each switching circuit for each fixed capacitor of each EVC comprises a switch operably coupled to the fixed capacitor to cause the switching in and out of the fixed capacitor, the switch comprising at least one string of series-connected diodes, each of the diodes of the series-connected diodes being a PIN diode or an NIP diode; wherein, for each of the at least one string, at least one of the diodes of the string having a balancing capacitor parallel to the diode.

In yet another aspect, and RF impedance matching circuit includes an RF input configured to operably couple to an RF source providing an RF signal; an RF output configured to operably couple to a plasma chamber; at least one electronically variable capacitor (EVC), wherein each EVC of the at least one EVC comprises fixed capacitors, each of the fixed capacitors having a corresponding switching circuit for switching in and out the fixed capacitor to alter a total capacitance of the EVC; and a control circuit configured to cause the switching in and out of the fixed capacitors of each EVC to enable an impedance match; wherein each switching circuit for each fixed capacitor of each EVC comprises a switch operably coupled to the fixed capacitor to cause the switching in and out of the fixed capacitor, the switch comprising at least one string of series-connected diodes, each of the diodes of the series-connected diodes being a PIN diode or an NIP diode; and wherein each of the series-connected diodes is positioned directly on a heat sink that does not conduct electricity.

In another aspect, a method of matching an impedance includes coupling a radio frequency (RF) input of a matching circuit to an RF source providing an RF signal; coupling an RF output of the matching circuit to a plasma chamber, wherein the matching circuit comprises at least one electronically variable capacitor (EVC), wherein each EVC of the at least one EVC comprises fixed capacitors, each of the fixed capacitors having a corresponding switching circuit for switching in and out the fixed capacitor to alter a total capacitance of the EVC; and a control circuit configured to cause the switching in and out of the fixed capacitors of each EVC to enable an impedance match; wherein each switching circuit for each fixed capacitor of each EVC comprises a switch operably coupled to the fixed capacitor to cause the switching in and out of the fixed capacitor, the switch comprising at least one string of series-connected diodes, each of the diodes of the series-connected diodes being a PIN diode or an NIP diode; and wherein each of the series-connected diodes is positioned directly on a heat sink that does not conduct electricity; and matching an impedance by at least one of the switching circuits of the at least one EVC switching in or out its corresponding fixed capacitor to alter a total capacitance of the EVC.

In another aspect, a semiconductor processing tool includes a plasma chamber configured to deposit a material onto a substrate or etch a material from the substrate; and an impedance matching circuit operably coupled to the plasma chamber, the matching circuit comprising an RF input configured to operably couple to an RF source providing an RF signal; an RF output configured to operably couple to the plasma chamber; at least one electronically variable capacitor (EVC), wherein each EVC of the at least one EVC comprises fixed capacitors, each of the fixed capacitors having a corresponding switching circuit for switching in and out the fixed capacitor to alter a total capacitance of the EVC; and a control circuit configured to cause the switching in and out of the fixed capacitors of each EVC to enable an impedance match; wherein each switching circuit for each fixed capacitor of each EVC comprises a switch operably coupled to the fixed capacitor to cause the switching in and out of the fixed capacitor, the switch comprising at least one string of series-connected diodes, each of the diodes of the series-connected diodes being a PIN diode or an NIP diode; and wherein each of the series-connected diodes is positioned directly on a heat sink that does not conduct electricity.

In another aspect, a method of fabricating a semiconductor includes placing a substrate in a plasma chamber configured to deposit a material layer on the substrate or etch a material layer from the substrate; energizing plasma within the plasma chamber by coupling RF power from an RF source to the plasma chamber to perform the deposition or etching; and while energizing the plasma, carrying out an impedance match by an impedance matching circuit coupled between the plasma chamber and the RF source, the matching circuit comprising at least one electronically variable capacitor (EVC), wherein each EVC of the at least one EVC comprises fixed capacitors, each of the fixed capacitors having a corresponding switching circuit for switching in and out the fixed capacitor to alter a total capacitance of the EVC; and a control circuit configured to cause the switching in and out of the fixed capacitors of each EVC to enable an impedance match; wherein each switching circuit for each fixed capacitor of each EVC comprises a switch operably coupled to the fixed capacitor to cause the switching in and out of the fixed capacitor, the switch comprising at least one string of series-connected diodes, each of the diodes of the series-connected diodes being a PIN diode or an NIP diode; and wherein each of the series-connected diodes is positioned directly on a heat sink that does not conduct electricity.

BRIEF DESCRIPTION OF THE DRAWINGS

The present disclosure will become more fully understood from the detailed description and the accompanying drawings, wherein.

DETAILED DESCRIPTION

Figures 1, 2:
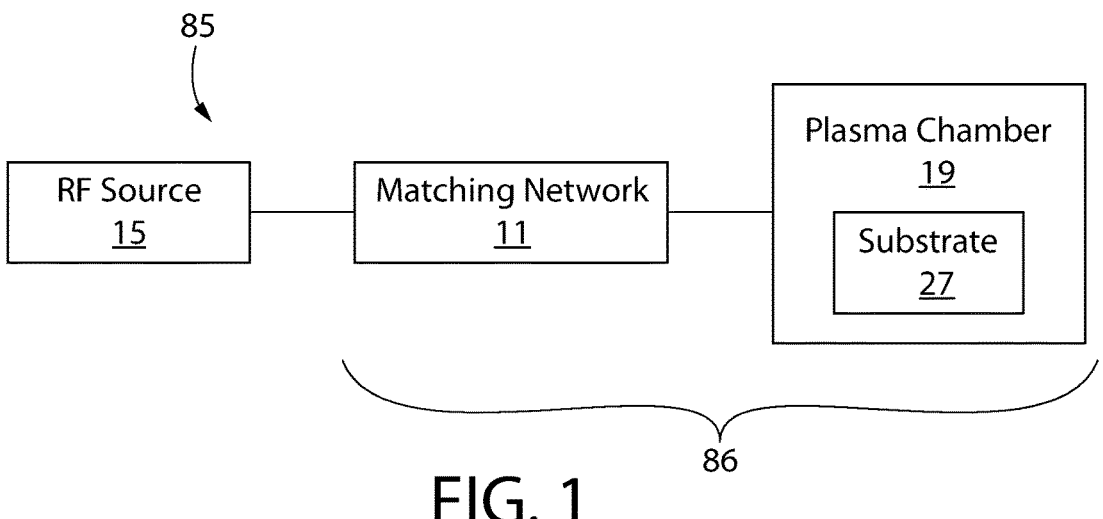
FIG. 1 is a block diagram of an embodiment of a semiconductor processing system.
FIG. 2 is a block diagram of an embodiment of a semiconductor processing system having an L-configuration matching network.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present inventions. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

Features of the present inventions may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present invention may be embodied in the form of computer-implemented processes and apparatuses such as processor-based data processing and communication systems or computer systems for practicing those processes. The present invention may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

In the following description, where circuits are shown and described, one of skill in the art will recognize that, for the sake of clarity, not all peripheral circuits or components are shown in the figures or described in the description. Further, the terms "couple" and "operably couple" can refer to a direct or indirect coupling of two components of a circuit.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. Relative terms such as "lower." "upper." "horizontal," "vertical," "above," "below," "up." "down," "left," "right." "top." "bottom," "front" and "rear" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected." "coupled," "interconnected." "secured" and other similar terms refer to a relationship wherein structures are secured or attached to one another either directly or indirectly through intervening structures, as well as both movable or rigid attachments or relationships, unless expressly described otherwise. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

Semiconductor Processing System

Referring to FIG. 1, a semiconductor device processing system 5 utilizing an RF generator 15 is shown. The system 85 includes an RF generator 15 and a semiconductor processing tool 86. The semiconductor processing tool 86 includes a matching network 11 and a plasma chamber 19. In other embodiments, the generator 15 or other power source can form part of the semiconductor processing tool.

The semiconductor device can be a microprocessor, a memory chip, or other type of integrated circuit or device. A substrate 27 can be placed in the plasma chamber 19, where the plasma chamber 19 is configured to deposit a material layer onto the substrate 27 or etch a material layer from the substrate 27. Plasma processing involves energizing a gas mixture by imparting energy to the gas molecules by introducing RF energy into the gas mixture. This gas mixture is typically contained in a vacuum chamber (the plasma chamber 19), and the RF energy is typically introduced into the plasma chamber 19 through electrodes. Thus, the plasma can be energized by coupling RF power from an RF source 15 into the plasma chamber 19 to perform deposition or etching.

In a typical plasma process, the RF generator 15 generates power at a radio frequency—which is typically within the range of 3 kHz and 300 GHz—and this power is transmitted through RF cables and networks to the plasma chamber 19. In order to provide efficient transfer of power from the RF generator 15 to the plasma chamber 19, an intermediary circuit is used to match the fixed impedance of the RF generator 15 with the variable impedance of the plasma chamber 19. Such an intermediary circuit is commonly referred to as an RF impedance matching network, or more simply as an RF matching network. The purpose of the RF matching network 11 is to transform the variable plasma impedance to a value that more closely matches the fixed impedance of the RF generator 15. Commonly owned U.S. Publication Nos. 2021/0183623 and 2021/0327684, the disclosures of which are incorporated herein by reference in their entirety, provide examples of such matching networks.

Matching Network

FIG. 2 is a block diagram of an embodiment of a semiconductor processing system 85 having a processing tool 86 that includes an L-configuration RF impedance matching network 11. As will be discussed in further detail below, the exemplified matching network 11 utilizes electronically variable capacitors (EVCs) for both the shunt variable capacitor 33 and the series variable capacitor 31. It is noted that the invention is not so limited. For example, one of the EVCs (e.g., shunt EVC 33) may be a mechanically variable VVC, or may be replaced with a variable inductor.

The exemplified matching network 11 has an RF input 13 connected to an RF source 15 and an RF output 17 connected to a plasma chamber 19. An RF input sensor 21 can be connected between the RF impedance matching network 11 and the RF source 15. An RF output sensor 49 can be connected between the RF impedance matching network 11 and the plasma chamber 19 so that the RF output from the impedance matching network, and the plasma impedance presented by the plasma chamber 19, may be monitored. Certain embodiments may include only one of the input sensor 21 and the output sensor 49. The functioning of these sensors 21, 49 are described in greater detail below.

As discussed above, the RF impedance matching network 11 serves to help maximize the amount of RF power transferred from the RF source 15 to the plasma chamber 19 by matching the impedance at the RF input 13 to the fixed impedance of the RF source 15. The matching network 11 can consist of a single module within a single housing designed for electrical connection to the RF source 15 and plasma chamber 19. In other embodiments, the components of the matching network 11 can be located in different housings, some components can be outside of the housing, and/or some components can share a housing with a component outside the matching network.

As is known in the art, the plasma within a plasma chamber 19 typically undergoes certain fluctuations outside of operational control so that the impedance presented by the plasma chamber 19 is a variable impedance. Since the variable impedance of the plasma chamber 19 cannot be fully controlled, and an impedance matching network may be used to create an impedance match between the plasma chamber 19 and the RF source 15. Moreover, the impedance of the RF source 15 may be fixed at a set value by the design of the particular RF source 15. Although the fixed impedance of an RF source 15 may undergo minor fluctuations during use, due to, for example, temperature or other environmental variations, the impedance of the RF source 15 is still considered a fixed impedance for purposes of impedance matching because the fluctuations do not significantly vary the fixed impedance from the originally set impedance value. Other types of RF source 15 may be designed so that the impedance of the RF source 15 may be set at the time of, or during, use. The impedance of such types of RF sources 15 is still considered fixed because it may be controlled by a user (or at least controlled by a programmable controller) and the set value of the impedance may be known at any time during operation, thus making the set value effectively a fixed impedance.

The RF source 15 may be an RF generator of a type that is well-known in the art, and generates an RF signal at an appropriate frequency and power for the process performed within the plasma chamber 19. The RF source 15 may be electrically connected to the RF input 13 of the RF impedance matching network 11 using a coaxial cable, which for impedance matching purposes would have the same fixed impedance as the RF source 15.

The plasma chamber 19 includes a first electrode 23 and a second electrode 25, and in processes that are well known in the art, the first and second electrodes 23, 25, in conjunction with appropriate control systems (not shown) and the plasma in the plasma chamber, enable one or both of deposition of materials onto a substrate 27 and etching of materials from the substrate 27.

In the exemplified embodiment, the RF impedance matching network 11 includes a series variable capacitor 31, a shunt variable capacitor 33, and a series inductor 35 to form an 'L' type matching network. The shunt variable capacitor 33 is shown shunting to a reference potential, in this case ground 40, between the series variable capacitor 31 and the series inductor 35, and one of skill in the art will recognize that the RF impedance matching network 11 may be configured with the shunt variable capacitor 33 shunting to a reference potential at the RF input 13 or at the RF output 17.

Figure 3:
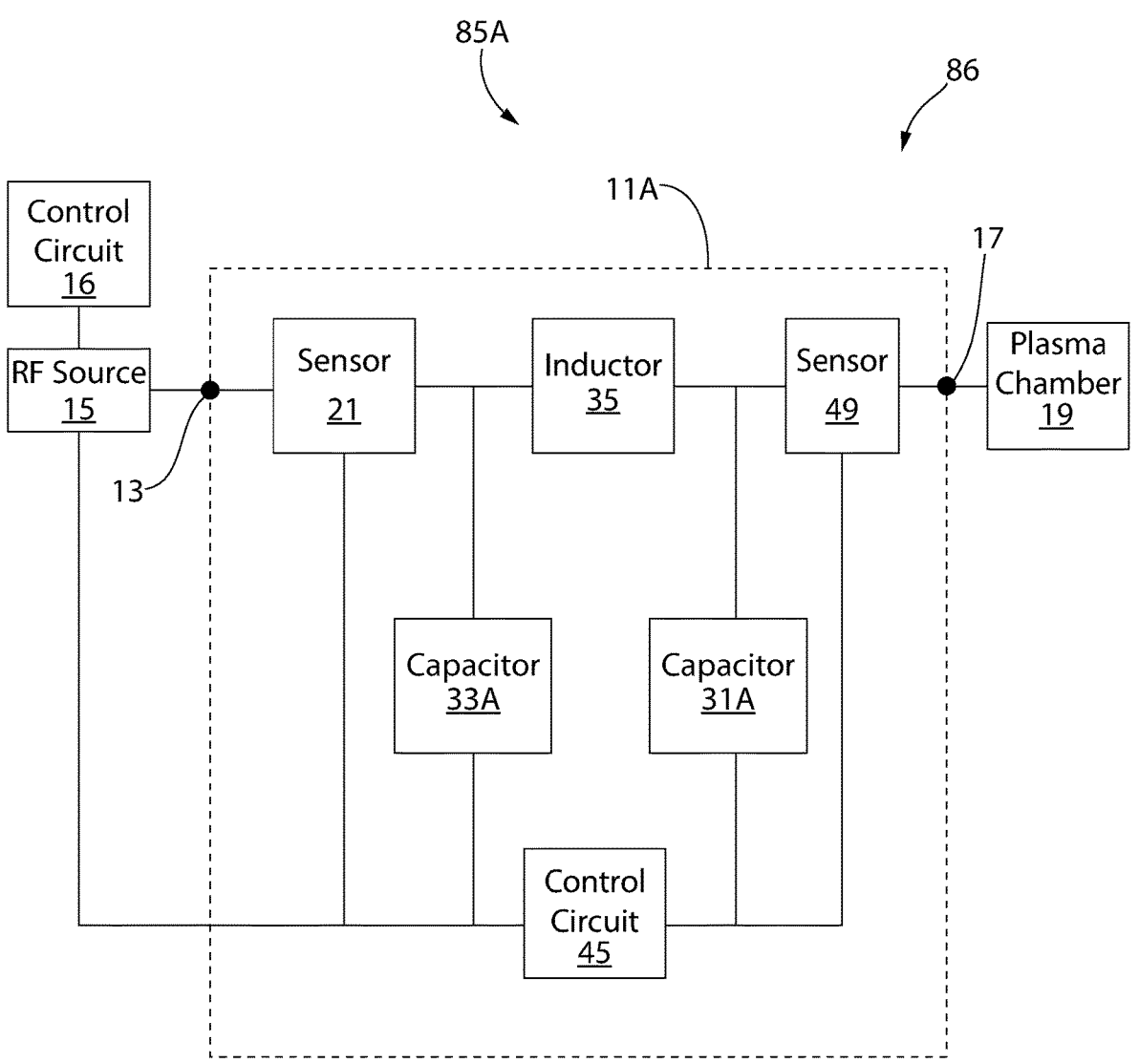
FIG. 3 is a block diagram of an embodiment of a semiconductor processing system having a pi-configuration matching network.

Alternatively, the RF impedance matching network 11 may be configured in other matching network configurations, such as a 'T' type configuration or a 'Π' or 'pi' type configuration, as will be shown in FIG. 3. In certain embodiments, the variable capacitors and the switching circuit described below may be included in any configuration appropriate for an RF impedance matching network.

In the exemplified embodiment, each of the series variable capacitor 31 and the shunt variable capacitor 33 may be an electronic variable capacitor (EVC), as described in U.S. Pat. No. 7,251,121, the EVC being effectively formed as a capacitor array formed by a plurality of discrete capacitors. The series variable capacitor 31 is coupled in series between the RF input 13 and the RF output 17 (which is also in parallel between the RF source 15 and the plasma chamber 19). The shunt variable capacitor 33 is coupled in parallel between the RF input 13 and ground 40. In other configurations, the shunt variable capacitor 33 may be coupled in parallel between the RF output 19 and ground 40. Other configurations may also be implemented without departing from the functionality of an RF matching network. In still other configurations, the shunt variable capacitor 33 may be coupled in parallel between a reference potential and one of the RF input 13 and the RF output 19.

The series variable capacitor 31 is connected to a series RF choke and filter circuit 37 and to a series driver circuit 39. Similarly, the shunt variable capacitor 33 is connected to a shunt RF choke and filter circuit 41 and to a shunt driver circuit 43. Each of the series and shunt driver circuits 39, 43 are connected to a control circuit 45, which is configured with an appropriate processor and/or signal generating circuitry to provide an input signal for controlling the series and shunt driver circuits 39, 43. A power supply 47 is connected to each of the RF input sensor 21, the series driver circuit 39, the shunt driver circuit 43, and the control circuit 45 to provide operational power, at the designed currents and voltages, to each of these components. The voltage levels provided by the power supply 47, and thus the voltage levels employed by each of the RF input sensor 21, the series driver circuit 39, the shunt driver circuit 43, and the control circuit 45 to perform the respective designated tasks, is a matter of design choice. In other embodiments, a variety of electronic components can be used to enable the control circuit 45 to send instructions to the variable capacitors. Further, while the driver circuit and RF choke and filter are shown as separate from the control circuit 45, these components can also be considered as forming part of the control circuit 45.

In the exemplified embodiment, the control circuit 45 includes a processor. The processor may be any type of properly programmed processing device (or collection of two or more processing devices working together), such as a computer or microprocessor, configured for executing computer program instructions (e.g., code). The processor may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network to perform the functions described herein.

With the combination of the series variable capacitor 31 and the shunt variable capacitor 33, the combined impedances of the RF impedance matching network 11 and the plasma chamber 19 may be controlled, using the control circuit 45, the series driver circuit 39, the shunt driver circuit 43, to match, or at least to substantially match, the fixed impedance of the RF source 15.

The control circuit 45 is the brains of the RF impedance matching network 11, as it receives multiple inputs, from sources such as the RF input sensor 21 and the series and shunt variable capacitors 31, 33, makes the calculations necessary to determine changes to the series and shunt variable capacitors 31, 33, and delivers commands to the series and shunt variable capacitors 31, 33 to create the impedance match. The control circuit 45 is of the type of control circuit that is commonly used in semiconductor fabrication processes, and therefore known to those of skill in the art. Any differences in the control circuit 45, as compared to control circuits of the prior art, arise in programming differences to account for the speeds at which the RF impedance matching network 11 is able to perform switching of the variable capacitors 31, 33 and impedance matching.

Each of the series and shunt RF choke and filter circuits 37, 41 are configured so that DC signals may pass between the series and shunt driver circuits 39, 43 and the respective series and shunt variable capacitors 31, 33, while at the same time the RF signal from the RF source 15 is blocked to prevent the RF signal from leaking into the outputs of the series and shunt driver circuits 39, 43 and the output of the control circuit 45. The series and shunt RF choke and filter circuits 37, 41 are of a type known to those of skill in the art.

FIG. 3 is a block diagram of an embodiment of a semiconductor processing system 85A having a pi-configuration matching network 11A, as opposed to the L-configuration matching network of FIG. 2. For ease of understanding, this figure omits the RF chokes and filters, driver circuits, and power supplies of FIG. 2. Where FIG. 3 uses reference numbers identical to those of FIG. 2, it is understood that the relevant components can have features similar to those discussed with regard to FIG. 2.

The most significant difference between the L- and pi-configuration is that the L-configuration utilizes a series capacitor 31 and shunt capacitor 33, while the pi-configuration utilizes two shunt capacitors 31A, 33A. Nevertheless, the control circuit can alter the capacitance of these shunt variable capacitors 31A, 33A to cause an impedance match. Each of these shunt variable capacitors 31A, 33A can be an EVC, as discussed above. They can be controlled by a choke, filter, and driver similar to the methods discussed above with respect to FIG. 2.

EVC Capacitor Arrays

Figure 4:
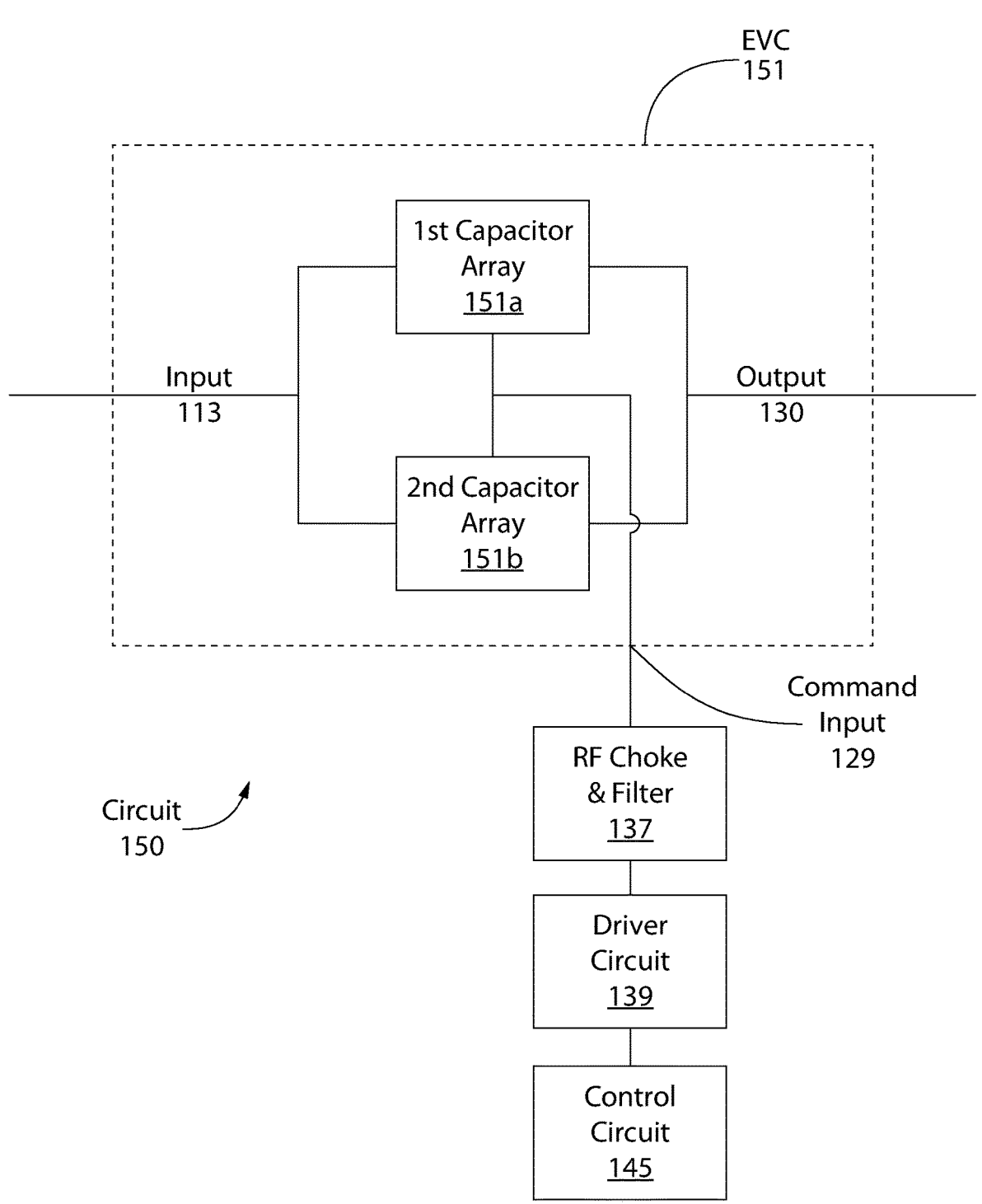
FIG. 4 is a block diagram for an embodiment of a circuit for providing a variable capacitance using an electronically variable capacitor.

FIG. 4 is a block diagram for an embodiment of an electronic circuit 150 for providing a variable capacitance using an electronically variable capacitor 151. The circuit 150 utilizes an EVC 151 that includes two capacitor arrays 151a, 151b. The exemplified first capacitor array 151a has a first plurality of discrete fixed capacitors, each having a first capacitance value. The second capacitor array 151b has a second plurality of discrete fixed capacitors, each having a second capacitance value. The first capacitance value is different from the second capacitance value such that the EVC 151 can provide coarse and fine control of the capacitance produced by the EVC 151. The first capacitor array and the second capacitor array are coupled in parallel between a signal input 113 and a signal output 130.

The first and second capacitance values can be any values sufficient to provide the desired overall capacitance values for the EVC 151. In one embodiment, the second capacitance value is less than or equal to one-half ($\frac{1}{2}$) of the first capacitance value. In another embodiment, the second capacitance value is less than or equal to one-third ($\frac{1}{3}$) of the first capacitance value. In yet another embodiment, the second capacitance value is less than or equal to one-fourth ($\frac{1}{4}$) of the first capacitance value.

The electronic circuit 150 further includes a control circuit 145, which can have features similar to control circuit 45 discussed above. The control circuit 145 is operably coupled to the first capacitor array 151a and to the second capacitor array 151b by a command input 129, the command input 129 being operably coupled to the first capacitor array 151a and to the second capacitor array 151b. In the exemplified embodiment, the command input 129 has a direct electrical connection to the capacitor arrays 151a, 151b, though in other embodiments this connection can be indirect. The coupling of the control circuit 145 to the capacitor arrays 151a, 151b will be discussed in further detail below.

The control circuit 145 is configured to alter the variable capacitance of the EVC 151 by controlling on and off states of (a) each discrete fixed capacitor of the first plurality of discrete fixed capacitors and (b) each discrete fixed capacitor of the second plurality of discrete fixed capacitors. As stated above, the control circuit 145 can have features similar to those described with respect to control circuit 45 of the preceding figures. For example, the control circuit 145 can receive inputs from the capacitor arrays 151a, 151b, make calculations to determine changes to capacitor arrays 151a, 151b, and delivers commands to the capacitor arrays 151a, 151b for altering the capacitance of the EVC 151. EVC 151 of FIG. 4 can include a plurality of electronic switches. Each electronic switch can be configured to activate and deactivate one or more discrete capacitors.

As with the control circuit 45 of the preceding figures, the control circuit 145 can also be connected to a driver circuit 139 and an RF choke and filter circuit 137. The control circuit 145, driver circuit 139, and RF choke and filter circuit 137 can have capabilities similar to those discussed with regard to the preceding figures. In the exemplified embodiment, the driver circuit 139 is operatively coupled between the control circuit 145 and the first and second capacitor arrays 151a, 151b. The driver circuit 139 is configured to alter the variable capacitance based upon a control signal received from the control circuit 145. The RF filter 137 is operatively coupled between the driver circuit 139 and the first and second capacitor arrays 151a, 151b. In response to the control signal sent by the control unit 145, the driver circuit 139 and RF filter 137 are configured to send a command signal to the command input 129. The command signal is configured to alter the variable capacitance by instructing at least one of the electronic switches to activate or deactivate (a) at least one the discrete capacitors of the first plurality of discrete capacitors or (b) at least one of the discrete capacitors of the second plurality of discrete capacitors.

In the exemplified embodiment, the driver circuit 139 is configured to switch a high voltage source on or off in less than 15 μsec, the high voltage source controlling the electronic switches of each of the first and second capacitor arrays for purposes of altering the variable capacitance. The EVC 151, however, can be switched by any of the means or speeds discussed in the present application.

The control circuit 145 can be configured to calculate coarse and fine capacitance values to be provided by the respective capacitor arrays 151a, 151b. In the exemplified embodiment, the control circuit 145 is configured to calculate a coarse capacitance value to be provided by controlling the on and off states of the first capacitor array 151a. Further, the control circuit is configured to calculate a fine capacitance value to be provided by controlling the on and off states of the second capacitor array 151b. In other embodiments, the capacitor arrays 151a, 151b can provide alternative levels of capacitance. In other embodiments, the EVC can utilize additional capacitor arrays.

EVC 151 of FIG. 4 can be used in a variety of systems requiring a varying capacitance. For example, EVC 151 can be used as the series EVC and/or shunt EVC in an L matching network, or as one or both of the shunt EVCs in a pi matching network. It is often desired that the differences between the capacitance values allow for both a sufficiently fine resolution of the overall capacitance of the circuit and a wide range of capacitance values to enable a better impedance match at the input of a RF matching network, and EVC 151 allows this.

Switching in and Out Discrete Capacitors to Vary EVC Capacitance

As discussed above, an EVC is a type of variable capacitor that can use multiple switches, each used to create an open or short circuit, with individual series capacitors to change the capacitance of the variable capacitor. The switches can be mechanical (such as relays) or solid state (such as PIN diodes, transistors, or other switching devices).

The following is a discussion of methods for setting up an EVC or other variable capacitor to provide varying capacitances.

In what is sometimes referred to as an "accumulative setup" of an EVC or other variable capacitor, the approach to linearly increase the capacitor value from the minimum starting point (where all switches are open) is to incrementally increase the number of fine tune capacitors that are switched into the circuit. Once the maximum number of fine tune capacitors is switched into circuit, a coarse tune capacitor is switched in, and the fine tune capacitors are switched out. The process starts over with increasing the number of fine tune capacitors that are switched into circuit, until all fine and coarse tune capacitors are switched in, at which point another coarse tune capacitor is switched in and the fine tune capacitors are switched out. This process can continue until all the coarse and fine capacitors are switched in.

In this embodiment, all of the fine tune capacitors have the same or a substantially similar value, and all the coarse tune capacitors have the same or a substantially similar value. Further, the capacitance value of one coarse tune capacitor about equals the combined capacitance value of all fine tune capacitors plus an additional fine tune capacitor into the circuit, thus enabling a linear increase in capacitance. The embodiments, however, are not so limited. The fine tune capacitors (and coarse capacitors) need not have the same or a substantially similar value. Further, the capacitance value of one coarse tune capacitor need not equal the combined capacitance value of all fine tune capacitors plus an additional fine tune capacitor. In one embodiment, the coarse capacitance value and the fine capacitance value have a ratio substantially similar to 10:1. In another embodiment, the second capacitance value is less than or equal to one-half (½) of the first capacitance value. In another embodiment, the second capacitance value is less than or equal to one-third (⅓) of the first capacitance value. In yet another embodiment, the second capacitance value is less than or equal to one-fourth (¼) of the first capacitance value.

An example of the aforementioned embodiment in an ideal setting would be if the fine tune capacitors were equal to 1 pF, and the coarse tune capacitors were equal to 10 pF. In this ideal setup, when all switches are open, the capacitance is equal to 0 pF. When the first switch is closed, there is 1 pF in the circuit. When the second switch is closed there is 2 pF in the circuit, and so on, until nine fine tune switches are closed, giving 9 pF. Then, the first 10 pF capacitor is switched into circuit and the nine fine tune switches are opened, giving a total capacitance of 10 pF. The fine tune capacitors are then switched into circuit from 11 pF to 19 pF. Another coarse tune capacitor can then be switched into circuit and all fine tune capacitors can be switched out of circuit giving 20 pF. This process can be repeated until the desired capacitance is reached.

This can also be taken one step further. Using the previous example, having nine 1 pF capacitors and also nine 10 pF capacitors, the variable capacitor circuit can have even larger values, 100 pF, to switch in and out of circuit. This would allow the previous capacitor array to go up to 99 pF, and then the 100 pF capacitor can be used for the next increment. This can be repeated further using larger increments, and can also be used with any counting system. According to the accumulative setup, increasing the total capacitance of a variable capacitor is achieved by switching in more of the coarse capacitors or more of the fine capacitors than are already switched in without switching out a coarse capacitor that is already switched in. Further, when the variable total capacitance is increased and the control circuit does not switch in more of the coarse capacitors than are already switched in, then the control circuit switches in more fine capacitors than are already switched in without switching out a fine capacitor that is already switched in. U.S. Pat. Nos. 10,431,428 and 11,195,698 regarding accumulative setup are incorporated herein by reference in their entirety. It is noted that the claimed invention is not limited to use of the accumulative setup. For example, U.S. Pat. Nos. 10,679,824 and 10,692,699, incorporated herein by reference in their entirety, discusses alternative setups, such as "partial binary."

Figure 5:
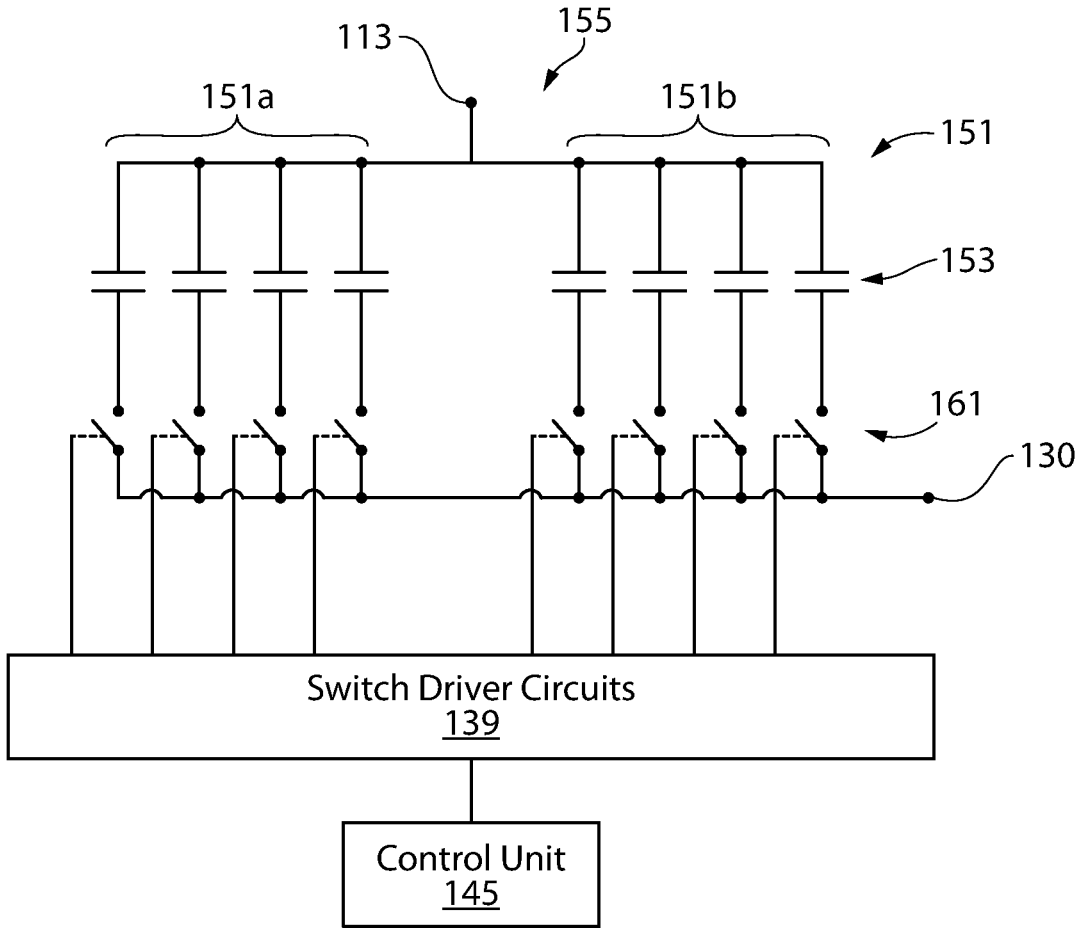
FIG. 5 is a schematic of a variable capacitance system for switching in and out discrete capacitors of an electronically variable capacitor.

FIG. 5 is a schematic of a variable capacitance system 155 for switching in and out discrete fixed capacitors of an electronically variable capacitor. Where this figure uses reference numbers similar to those of FIG. 4, it is understood that the relevant components can have features similar to those discussed in FIG. 4. The variable capacitance system 155 comprises a variable capacitor 151 for providing a varying capacitance. The variable capacitor 151 has an input 113 and an output 130. The variable capacitor 151 includes a plurality of discrete fixed capacitors 153 operably coupled in parallel. The plurality of capacitors 153 includes first (fine) capacitors 151a and second (coarse) capacitors 151B. Further, the variable capacitor 151 includes a plurality of switches 161. Of the switches 161, one switch is operably coupled in series to each of the plurality of capacitors to switch in and out each capacitor, thereby enabling the variable capacitor 151 to provide varying total capacitances. The variable capacitor 151 has a variable total capacitance that is increased when discrete capacitors 153 are switched in and decreased when the discrete capacitors 153 are switched out.

The switches 161 can be coupled to switch driver circuits 139 for driving the switches on and off. The variable capacitance system 155 can further include a control unit 145 operably coupled to the variable capacitor 151. Specifically, the control unit 145 can be operably coupled to the driver circuits 139 for instructing the driver circuits 139 to switch one or more of the switches 161, and thereby turn one or more of the capacitors 153 on or off. In one embodiment, the control unit 145 can form part of a control unit that controls a variable capacitor, such as a control unit that instructs the variable capacitors of a matching network to change capacitances to achieve an impedance match. The driver circuits 139 and control unit 145 can have features similar to those discussed above with reference to FIG. 4, and thus can also utilize an RF choke and filter as discussed above.

Switching Circuit for Electronically Variable Capacitor

Figure 6:
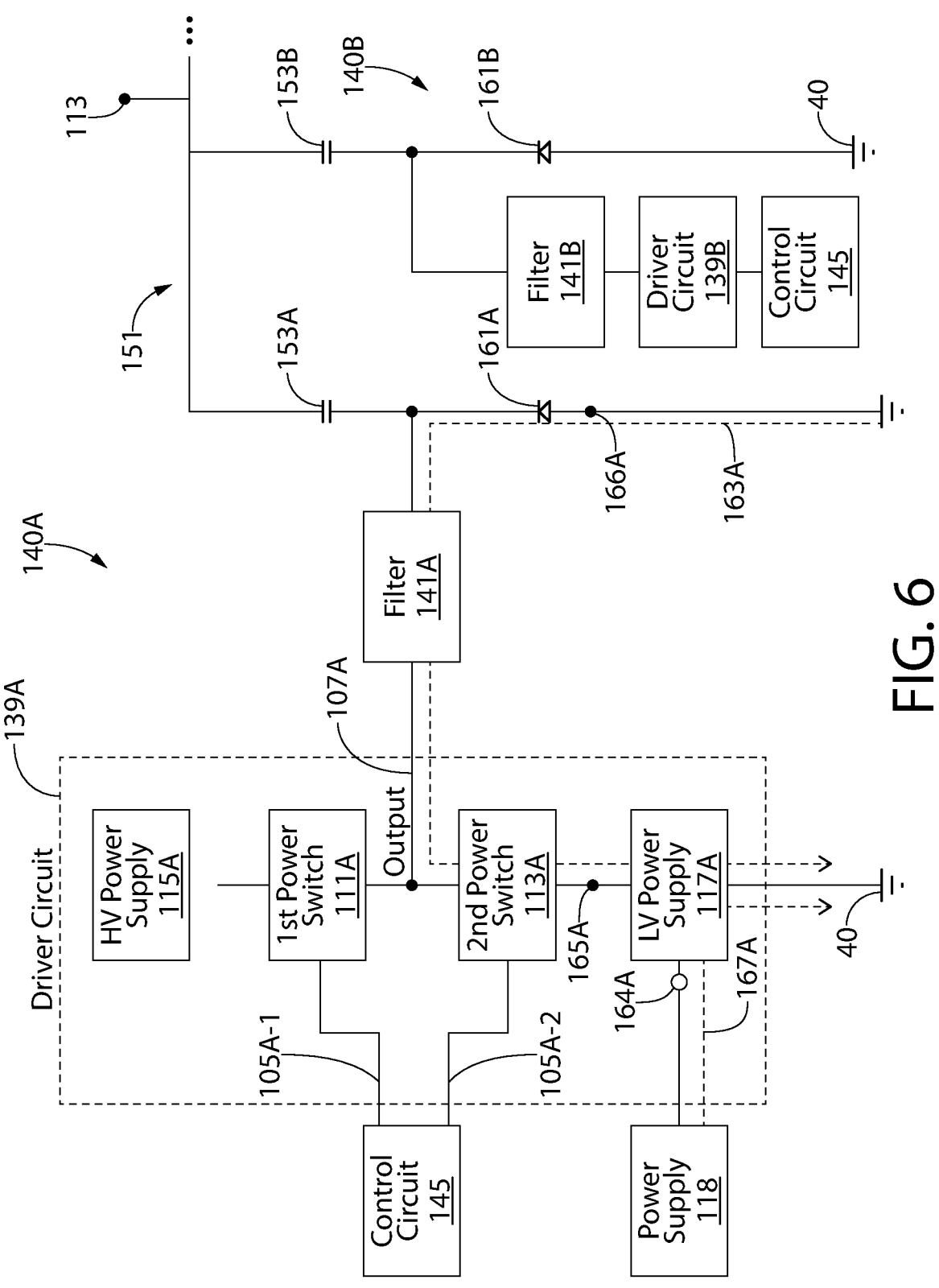
FIG. 6 is a block diagram of an embodiment of a switching circuit for an EVC.

FIG. 6 shows an embodiment of a switching circuit 140A for an EVC 151 of a matching network according to one embodiment. In the exemplified embodiment, the EVC 151 is the EVC 151 of FIG. 5, but the EVC of the invention is not so limited, as it can have any of the alternative features discussed herein, including a different number of discrete fixed capacitors 153, and discrete fixed capacitors of different values than those discussed with respect to FIG. 5. Further, the EVC can form part of any type of matching network, including the various types of matching networks discussed herein. The exemplified matching network is coupled between an RF source and a plasma chamber, as shown, for example, in the preceding figures.

The exemplified EVC comprises a plurality of discrete fixed capacitors 153A, 153B coupled to a first terminal 113. Each discrete capacitor 153A, 153B has a corresponding switch 161A, 161B configured to switch in (or "ON") the discrete capacitor and switch out (or "OFF") the discrete capacitor to alter a total capacitance of the EVC 151. In the exemplified embodiment, the switch 161A is in series with the discrete capacitor 153A, but the invention is not so limited. Further, in the exemplified embodiment, the switch 161A is a PIN diode, but the invention is not so limited, and may be another type of switch, such as a NIP diode. In yet other embodiments, the switch may be a MOSFET, a JFET, or another type of switch. Further, in the exemplified embodiment, the PIN diode has a common anode configuration such that the anode of each PIN diode 161A, 161B is coupled to a ground 40, which may be any common node. The invention is not so limited, however, since in other embodiments the EVC may use a common cathode configuration such that the cathode of each PIN diode is coupled to the ground 40 (and the components of the driver circuit are altered accordingly). Further, it is noted that two or more switches may be used in series to increase the voltage rating and/or two or more switches may be used in parallel to increase the current rating of the channel.

Each PIN diode switch 161A, 161B has its own switching circuit 140A, 140B, which is connected to a control circuit 145. Switching circuit 140B is shown as including switch 161B, filter 141B (which may be similar to the filter circuits 37, 41 discussed above), and driver circuit 139B. The filter 141B can be, for example, an LC circuit similar to filter circuit 9 of U.S. Pat. No. 10,340,879, or the filter circuit beside output 207 in FIG. 6A of U.S. Pat. No. 9,844,127. Each of these patents is incorporated herein by reference in its entirety.

Exemplified switching circuit 140A has the same components as switching circuit 140B, but shows the driver circuit 139A in greater detail. The driver circuit 139A may be integrated with the PIN diode 161A (or other type of switch), or may be integrated with the discrete fixed capacitors of the EVC of the matching network. One of skill in the art will also recognize that certain components of the driver circuit 139A may be replaced with other components that perform the same essential function while also greater allowing variability in other circuit parameters (e.g., voltage range, current range, and the like).

The exemplified driver circuit 139A has two inputs 105A-1, 105A-2 for receiving control signals from the control circuit for controlling the voltage on the common output 107A that is connected to and drives the PIN diode 161A. The voltage on the common output 107A switches the PIN diode 161A between the ON state and the OFF state, thus also switching in/ON and out/OFF the discrete capacitor 153A to which the PIN diode 161A is connected. The state of the discrete capacitor, in this exemplary embodiment, follows the state of the corresponding PIN diode, such that when the PIN diode is ON, the discrete capacitor is also in/ON, and likewise, when the PIN diode 161A is OFF, the discrete capacitor is also out/OFF. Thus, statements herein about the state of the PIN diode 161A inherently describe the concomitant state of the corresponding discrete capacitor 153A of the EVC 151.

In a preferred embodiment, each of the first power switch 111A and the second power switch 113A is a MOSFET with a body diode, though in other embodiments either of the power switches can be another type of switch, including any other type of semiconductor switch. The invention may utilize a variety of switching circuit configurations. For example, the invention may utilize any of the switching circuits disclosed by U.S. Pat. No. 9,844,127, such as those shown in FIGS. 3, 6A, 6B, and any of the switching circuits disclosed by U.S. Pat. No. 10,340,879, such as the switching circuit shown at FIG. 18. As stated above, each of these patents is incorporated herein by reference in its entirety.

In the exemplified embodiment, a high voltage power supply 115A is connected to the first power switch 111A, providing a high voltage input which is to be switchably connected to the common output 107A. A low voltage power supply 117A is connected to the second power switch 113A, providing a low voltage input which is also to be switchably connected to the common output 107A. In the configuration of the driver circuit 139A shown, the low voltage power supply 117A may supply a low voltage input which is about −3.3V. Such a low voltage, with a negative polarity, is sufficient to provide a forward bias for switching the PIN diode 161A. For other configurations of the driver circuit 139A, a higher or lower voltage input may be used, and the low voltage input may have a positive polarity, depending upon the configuration and the type of electronic switch being controlled.

In the exemplified switching circuit 140A, the first power switch 111A and the second power switch 113A are configured to asynchronously connect the high-voltage power supply 115A and the low voltage power supply 117A to the common output 107A for purposes of switching the PIN diode 161A between the ON state and the OFF state, and thereby switching the corresponding discrete fixed capacitor 153A in and out. The high-voltage power supply 115A provides a reverse-biasing DC voltage for the PIN diode switch 161A. This may be referred to as a "blocking voltage" as it reverse-biases the PIN diode 161A and thus prevents current from flowing, thus switching out its corresponding discrete capacitor 153A. As used herein, the term "blocking voltage" will refer to any voltage used to cause a switch to switch out or in its corresponding discrete capacitor. It is further noted that the switching circuit is not limited to that shown in FIG. 6, but may be any circuit for switching in and out discrete capacitors, including those shown in U.S. Pat. No. 9,844,127, which is incorporated herein by reference in its entirety.

In the exemplified embodiment, the control circuit provides separate control signals to separate inputs 105A-1, 105A-2 of the driver circuit 139A. In this embodiment, the separate inputs 105A-1, 105A-2 are coupled to the first and second power switches 111A, 113A, respectively. The control signals to the separate inputs may be opposite in polarity. In a preferred embodiment, the first and second power switches 161A, 113A are MOSFETS, and the separate control signals go to separate drivers for powering the MOSFETs. In an alternative embodiment, the control circuit 145 provides a common input signal. The common input signal may asynchronously control the ON and OFF states of the first power switch 111A and the second power switch 113A, such that when the first power switch 111A is in the ON state, the second power switch 113A is in the OFF state, and similarly, when the first power switch is in the OFF state, the second power switch 113A is in the ON state. In this manner, the common input signal controls the first power switch 111A and the second power switch 113A to asynchronously connect the high voltage input and the low voltage input to the common output for purposes of switching the PIN diode 161A between the ON state and the OFF state. The invention, however, not limited to such asynchronous control.

The inputs 105A-1, 105A-2 may be configured to receive any type of appropriate control signal for the types of switches selected for the first power switch 111A and the second power switch 113A, which may be, for example, a +15 V control signal. In a preferred embodiment, the driver circuit has a separate driver for driving each of the first power switch 111A and second power switch 112A. In another embodiment, the first and second power switches 111A, 113A are selected so that they may receive a common input signal.

In the exemplified embodiment, a power supply 118 is coupled to an input of the low voltage power supply 117A. In a preferred embodiment, the power supply 118 provides 24 VDC. The invention, however, is not so limited, as other power supplies may be utilized.

In the exemplified embodiment, when the second power switch 113A is ON, a current 163A flows between the PIN diode 161A and the low voltage power supply 117A. At the same time, current flows from the power supply 118 to the input of low voltage power supply 117A, and to the ground 40. A sensor may be positioned at a node of the switching circuit 140A to measure a parameter associated with the current 163A flowing between the low voltage power supply 117A and the PIN diode switch 161A. In the exemplified embodiment, sensor 164A is positioned at an input of the low voltage power supply 117A, and measures the current 167A flowing into the input from the power supply 118, which is related to current 163A. In other embodiments, the sensor can be at other positions in the switching circuit 140A, such as at node 165A (the output of the low voltage power supply) or node 166A (the anode of PIN diode 161A) or in the path of the filter 141A between the driver circuit and the switch (e.g., driver output 107A or the output of filter 141A). In the exemplified embodiment, the parameter is the value of the current flowing at the node, but in other embodiments the parameter measured may be any parameter (including voltage) associated with current flowing through the switch or switches. In yet other embodiments, the parameter is any parameter associated with the driver circuit.

It is noted that the matching networks discussed herein may incorporate biasing circuits, such as those discussed in PCT/US22/23395, filed Apr. 5, 2022, which is incorporated herein by reference in its entirety. For example, a biasing inductor of the biasing circuit may be used in switching the fixed discrete capacitors of an EVC in the series position, this EVC not being grounded.

Determining Capacitance Values to Achieve Match

Figures 7, 8:
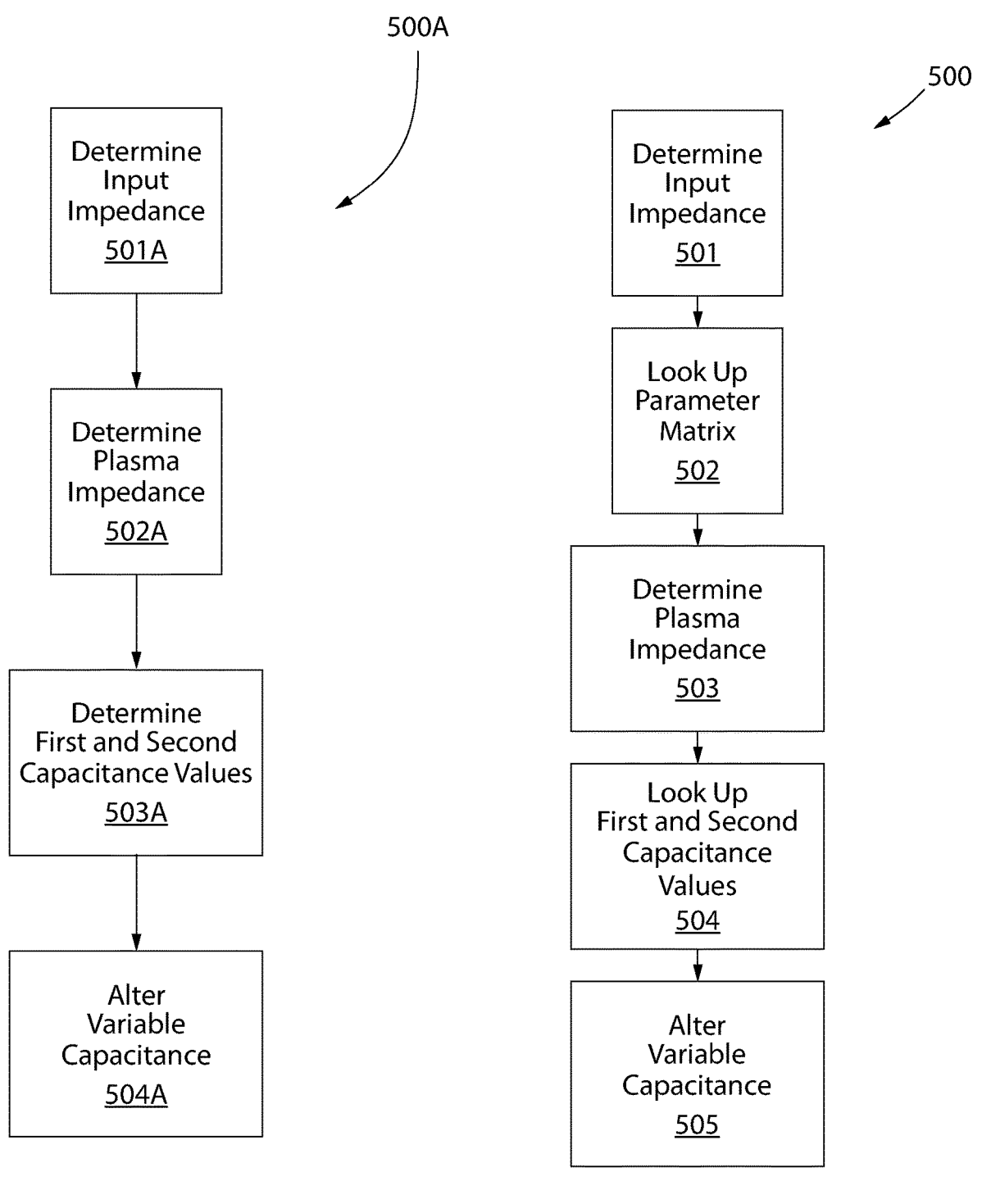
FIG. 7 is a flow chart for an exemplary process for matching an impedance by altering a variable capacitance.
FIG. 8 is a flow chart an exemplary process for matching an impedance using a parameter matrix to alter a variable capacitance.

FIG. 7 is a flow chart showing a process 500A for matching an impedance according to one embodiment. The matching network can include components similar to those discussed above. In one embodiment, the matching network of FIG. 3 is utilized. In the first step of the exemplified process 500A of FIG. 7, an input impedance at the RF input 13 is determined (step 501A). The input impedance is based on the RF input parameter detected by the RF input sensor 21 at the RF input 13. The RF input sensor 21 can be any sensor configured to detect an RF input parameter at the RF input 13. The input parameter can be any parameter measurable at the RF input 13, including a voltage, a current, or a phase at the RF input 13. In the exemplified embodiment, the RF input sensor 21 detects the voltage, current, and phase at the RF input 13 of the matching network 11. Based on the RF input parameter detected by the RF input sensor 21, the control circuit 45 determines the input impedance.

Next, the control circuit 45 determines the plasma impedance presented by the plasma chamber 19 (step 502A). In one embodiment, the plasma impedance determination is based on the input impedance (determined in step 501A), the capacitance of the series EVC 31, and the capacitance of the shunt EVC 33. In other embodiments, the plasma impedance determination can be made using the output sensor 49 operably coupled to the RF output, the RF output sensor 49 configured to detect an RF output parameter. The RF output parameter can be any parameter measurable at the RF output 17, including a voltage, a current, or a phase at the RF output 17. The RF output sensor 49 may detect the output parameter at the RF output 17 of the matching network 11. Based on the RF output parameter detected by the RF output sensor 21, the control circuit 45 may determine the plasma impedance. In yet other embodiments, the plasma impedance determination can be based on both the RF output parameter and the RF input parameter.

Once the variable impedance of the plasma chamber 19 is known, the control circuit 45 can determine the changes to make to the variable capacitances of one or both of the series and shunt EVCs 31, 33 for purposes of achieving an impedance match. Specifically, the control circuit 45 determines a first capacitance value for the series variable capacitance and a second capacitance value for the shunt variable capacitance (step 503A). These values represent the new capacitance values for the series EVC 31 and shunt EVC 33 to enable an impedance match, or at least a substantial impedance match. In the exemplified embodiment, the determination of the first and second capacitance values is based on the variable plasma impedance (determined in step 502A) and the fixed RF source impedance.

Once the first and second capacitance values are determined, the control circuit 45 generates a control signal to alter at least one of the series variable capacitance and the shunt variable capacitance to the first capacitance value and the second capacitance value, respectively (step 504A). This is done at approximately t=−5 μsec. The control signal instructs the switching circuit to alter the variable capacitance of one or both of the series and shunt EVCs 31, 33.

In the exemplified embodiment, the EVCs are altered while the RF source continues to provide the RF signal to the RF input to the matching network. There is no need to stop the provision of the RF signal before altering the EVCs. The determination of new capacitance values and the alteration of the EVCs can be done continuously (and repeatedly) while the RF signal continues to be provided to the matching network.

The alteration of the EVCs 31, 33 takes about 9-11 μsec total, as compared to about 1-2 sec of time for an RF matching network using VVCs. Once the switch to the different variable capacitances is complete, there is a period of latency as the additional discrete capacitors that make up the EVCs join the circuit and charge. This part of the match tune process takes about 55 μsec. Finally, the RF power profile 403 is shown decreasing, at just before t=56 μsec, from about 380 mV peak-to-peak to about 100 mV peak-to-peak. This decrease in the RF power profile 403 represents the decrease in the reflected power 407, and it takes place over a time period of about 10 μsec, at which point the match tune process is considered complete.

The altering of the series variable capacitance and the shunt variable capacitance can comprise sending a control signal to the series driver circuit 39 and the shunt driver circuit 43 to control the series variable capacitance and the shunt variable capacitance, respectively, where the series driver circuit 39 is operatively coupled to the series EVC 31, and the shunt driver circuit 43 is operatively coupled to the shunt EVC 43. When the EVCs 31, 33 are switched to their desired capacitance values, the input impedance may match the fixed RF source impedance (e.g., 50 Ohms), thus resulting in an impedance match. If, due to fluctuations in the plasma impedance, a sufficient impedance match does not result, the process of 500A may be repeated one or more times to achieve an impedance match, or at least a substantial impedance match.

Using an RF matching network 11, such as that shown in FIG. 3, the input impedance can be represented as follows:

$$Z_{in} = \frac{(Z_P + Z_L + Z_{series})Z_{shunt}}{Z_P + Z_L + Z_{series} + Z_{shunt}}$$

where $Z_{in}$ is the input impedance, $Z_P$ is the plasma impedance, $Z_L$ is the series inductor impedance, $Z_{series}$ is the series EVC impedance, and $Z_{shunt}$ is the shunt EVC impedance. In the exemplified embodiment, the input impedance ($Z_{in}$) is determined using the RF input sensor 21. The EVC impedances ($Z_{series}$ and $Z_{shunt}$) are known at any given time by the control circuitry, since the control circuitry is used to command the various discrete fixed capacitors of each of the series and shunt EVCs to turn ON or OFF. Further, the series inductor impedance ($Z_L$) is a fixed value. Thus, the system can use these values to solve for the plasma impedance ($Z_P$).

Based on this determined plasma impedance ($Z_P$) and the known desired input impedance ($Z_{in}'$) (which is typically 50 Ohms), and the known series inductor impedance ($Z_L$), the system can determine a new series EVC impedance ($Z_{series}'$) and shunt EVC impedance ($Z_{shunt}'$).

$$Z_{in}' = \frac{(Z_P + Z_L + Z_{series}')Z_{shunt}'}{Z_P + Z_L + Z_{series}' + Z_{shunt}'}$$

Based on the newly calculated series EVC variable impedance ($Z_{series}'$) and shunt EVC variable impedance ($Z_{shunt}'$), the system can then determine the new capacitance value (first capacitance value) for the series variable capacitance and a new capacitance value (second capacitance value) for the shunt variable capacitance. When these new capacitance values are used with the series EVC 31 and the shunt EVC 33, respectively, an impedance match may be accomplished.

The exemplified method of computing the desired first and second capacitance values and reaching those values in one step is significantly faster than moving the two EVCs step-by-step to bring either the error signals to zero, or to bring the reflected power/reflection coefficient to a minimum. In semiconductor plasma processing, where a faster tuning scheme is desired, this approach provides a significant improvement in matching network tune speed. It is noted that methods for determining new EVC capacitance values discussed herein are only examples. In other embodiments, other parameters and/or methods may be used to determine a new EVC capacitance value. For example, the parameter upon which a new capacitance value is based may be any parameter related to the plasma chamber.

Determining Capacitance Values Using Parameter Matrix

FIG. 8 provides an alternative process 500 for matching an impedance that uses a parameter matrix. In the exemplified process, the control circuit 45 (see FIG. 3 for matching network components) is configured and/or programmed to carry out each of the steps. As one of two initial steps, RF parameters are measured at the RF input 13 by the RF input sensor 21, and the input impedance at the RF input 13 is calculated (step 501) using the measured RF parameters. For this exemplified process 500, the forward voltage and the forward current are measured at the RF input 13. In certain other embodiments, the RF parameters may be measured at the RF output 17 by the RF output sensor 49, although in such embodiments, different calculations may be required than those described below. In still other embodiments, RF parameters may be measured at both the RF input 13 and the RF output 17.

The impedance matching circuit, coupled between the RF source 15 and the plasma chamber 19, may be characterized by one of several types of parameter matrices known to those of skill in the art, including two-port parameter matrices. An S-parameter matrix and a Z-parameter matrix are two examples of such parameter matrices. Other examples include, but are not limited to, a Y-parameter matrix, a G-parameter matrix, an H-parameter matrix, a T-parameter matrix, and an ABCD-parameter matrix. Those of skill in the art will recognize also that these various parameter matrices may be mathematically converted from one to the other for an electrical circuit such as a matching network. The second initial step of the exemplified process 500 is to look up (step 502) the parameter matrix for the existing configuration of the impedance matching circuit in a parameter lookup table. The existing configuration of the impedance matching circuit is defined by existing operational parameters of the impedance matching circuit, particularly the existing array configurations for both of the series EVC 31 and the shunt EVC 33. In order to achieve an impedance match, the existing configuration of the impedance matching circuit is altered to a new configuration of the impedance matching circuit as part of the exemplified process 500.

The parameter lookup table includes a plurality of parameter matrices, with each parameter matrix being associated with a particular configuration of the series EVC 31 and the shunt EVC 33. The parameter lookup table may include one or more of the aforementioned types of parameter matrices. In the exemplified process 500, the parameter lookup table includes at least a plurality of S-parameter matrices. In certain embodiments, the parameter lookup table may include at least a plurality of Z-parameter matrices. In embodiments in which the parameter lookup table includes multiple types of parameter matrices, the different types of parameter matrices are associated within the parameter lookup table in such a way so as to eliminate the need for mathematical conversions between the different types of parameter matrices. For example, the T-parameter matrix may be included as part of the parameter lookup table, with each T-parameter matrix associated with the associated S-parameter matrix that would result from conversion between the two matrices.

The input impedance calculation (step 501) and the parameter matrix look up (step 502) may be performed in any order. With the input impedance calculated (step 501) and the parameter matrix for the existing configuration of the impedance matching circuit identified within the parameter lookup table (step 502) done, the plasma or load impedance may then be calculated (step 503) using the calculated input impedance and the parameter matrix for the existing configuration. Next, from the calculated plasma impedance, the match configurations for the series EVC 31 and the shunt EVC 33 that would achieve an impedance match, or at least a substantial impedance match, between the RF source 15 and the plasma chamber 19 are looked up (step 504) in an array configuration lookup table. These match configurations from the array configuration lookup table are the array configurations which will result in new capacitance values for the series EVC 31 and shunt EVC 33, with an impedance match being achieved with the new array configurations and associated new capacitance values. The array configuration lookup table is a table of array configurations for the series EVC 31 and the shunt EVC 33, and it includes each possible array configuration of the series EVC 31 and the shunt EVC 33 when used in combination. As an alternative to using an array configuration lookup table, the actual capacitance values for the EVCs 31, 33 may be calculated during the process-however, such real-time calculations of the capacitance values are inherently slower than looking up the match configurations in the array configuration lookup table. After the match configurations for the series EVC 31 and the shunt EVC 33 are identified in the array configuration lookup table, then one or both of the series array configuration and the shunt array configuration are altered (step 505) to the respective identified match configurations for the series EVC 31 and the shunt EVC 33.

The altering (step 505) of the series array configuration and the shunt array configuration may include the control circuit 45 sending a control signal to the series driver circuit 39 and the shunt driver circuit 43 to control the series array configuration and the shunt array configuration, respectively, where the series driver circuit 39 is operatively coupled to the series EVC 31, and the shunt driver circuit 43 is operatively coupled to the shunt EVC 43. When the EVCs 31, 33 are switched to the match configurations, the input impedance may match the fixed RF source impedance (e.g., 50 Ohms), thus resulting in an impedance match. If, due to fluctuations in the plasma impedance, a sufficient impedance match does not result, the process of 500 may be repeated one or more times to achieve an impedance match, or at least a substantial impedance match.

The lookup tables used in the process described above are compiled in advance of the RF matching network being used in conjunction with the plasma chamber 19. In creating the lookup tables, the RF matching network 11 is tested to determine at least one parameter matrix of each type and the load impedance associated with each array configuration of the series EVC 31 and the shunt EVC 33 prior to use with a plasma chamber. The parameter matrices resulting from the testing are compiled into the parameter lookup table so that at least one parameter matrix of each type is associated with a respective array configuration of the EVCs 31, 33. Similarly, the load impedances are compiled into the array configuration lookup table so that each parameter matrix is associated with a respective array configuration of the EVCs 31, 33. The pre-compiled lookup tables may take into consideration the fixed RF source impedance (e.g., 50 Ohms), the power output of the RF source, and the operational frequency of the RF source, among other factors that are relevant to the operation of the RF matching network. Each lookup table may therefore have tens of thousands of entries, or more, to account for all the possible configurations of the EVCs 31, 33. The number of possible configurations is primarily determined by how many discrete fixed capacitors make up each of the EVCs 31, 33. In compiling the lookup tables, consideration may be given to possible safety limitations, such as maximum allowed voltages and currents at critical locations inside the matching network, and this may serve to exclude entries in one or more of the lookup tables for certain configurations of the EVCs 31, 33.

As is known in the art, the S-parameter matrix is composed of components called scatter parameters, or S-parameters for short. An S-parameter matrix for the impedance matching circuit has four S-parameters, namely $S_{11}$, $S_{12}$, $S_{21}$, and $S_{22}$, each of which represents a ratio of voltages at the RF input 13 and the RF output 17. All four of the S-parameters for the impedance matching circuit are determined and/or calculated in advance, so that the full S-parameter matrix is known. The parameters of the other types of parameter matrices may be similarly determined and/or calculated in advance and incorporated into the parameter matrix. For example, a Z-parameter matrix for the impedance matching circuit has four Z-parameters, namely $Z_{11}$, $Z_{12}$, $Z_{21}$, and $Z_{22}$.

By compiling the parameter lookup table in this manner, the entire time cost of certain calculations occurs during the testing phase for the RF matching network, and not during actual use of the RF matching network 11 with a plasma chamber 19. Moreover, because locating a value in a lookup table can take less time than calculating that same value in real time, using the lookup table can aid in reducing the overall time needed to achieve an impedance match. In a plasma deposition or etching process which includes potentially hundreds or thousands of impedance matching adjustments throughout the process, this time savings can help add directly to cost savings for the overall fabrication process.

From the beginning of the match tune process, which starts with the control circuit determining the variable impedance of the plasma chamber and determining the series and shunt match configurations, to the end of the match tune process, when the RF power reflected back toward the RF source decreases, the entire match tune process of the RF impedance matching network using EVCs has an elapsed time of approximately 110 μsec, or on the order of about 150 μsec or less. This short elapsed time period for a single iteration of the match tune process represents a significant increase over a VVC matching network. Moreover, because of this short elapsed time period for a single iteration of the match tune process, the RF impedance matching network using EVCs may iteratively perform the match tune process, repeating the two determining steps and the generating another control signal for further alterations to the array configurations of one or both of the electronically variable capacitors. By iteratively repeating the match tune process, it is anticipated that a better impedance match may be created within about 2-4 iterations of the match tune process. Moreover, depending upon the time it takes for each repetition of the match tune process, it is anticipated that 3-4 iterations may be performed in 500 μsec or less. Given the 1-2 sec match time for a single iteration of a match tune process for RF impedance matching networks using VVCs, this ability to perform multiple iterations in a fraction of the time represents a significant advantage for RF impedance matching networks using EVCs.

Those of skill in the art will recognize that several factors may contribute to the sub-millisecond elapsed time of the impedance matching process for an RF impedance matching network using EVCs. Such factors may include the power of the RF signal, the configuration and design of the EVCs, the type of matching network being used, and the type and configuration of the driver circuit being used. Other factors not listed may also contribute to the overall elapsed time of the impedance matching process. Thus, it is expected that the entire match tune process for an RF impedance matching network having EVCs should take no more than about 500 μsec to complete from the beginning of the process (i.e., measuring by the control circuit and calculating adjustments needed to create the impedance match) to the end of the process (the point in time when the efficiency of RF power coupled into the plasma chamber is increased due to an impedance match and a reduction of the reflected power). Even at a match tune process on the order of 500 μsec, this process time still represents a significant improvement over RF impedance matching networks using VVCs.

Table 1 presents data showing a comparison between operational parameters of one example of an EVC versus one example of a VVC. As can be seen, EVCs present several advantages, in addition to enabling fast switching for an RF impedance matching network:

TABLE 1

| Parameter | EVC | Typical 1000 pF Vacuum Capacitors |
|---|---|---|
| Capacitance | 20 pF~1400 pF | 15 pF~1000 pF |
| Reliability | High | Low |
| Response Time | ~500 μsec | 1 s~2 s |
| ESR | ~13 mW | ~20 mW |
| Voltage | 7 kV | 5 kV |
| Current Handling Capability | 216 A rms | 80 A rms |
| Volume | 4.5 in$^3$ | 75 in$^3$ |

As is seen, in addition to the fast switching capabilities made possible by the EVC, EVCs also introduce a reliability advantage, a current handling advantage, and a size advantage. Additional advantages of the RF impedance matching network using EVCs and/or the switching circuit itself for the EVCs include:

The disclosed RF impedance matching network does not include any moving parts, so the likelihood of a mechanical failure reduced to that of other entirely electrical circuits which may be used as part of the semiconductor fabrication process. For example, the typical EVC may be formed from a rugged ceramic substrate with copper metallization to form the discrete capacitors. The elimination of moving parts also increases the resistance to breakdown due to thermal fluctuations during use.

The EVC has a compact size as compared to a VVC, so that the reduced weight and volume may save valuable space within a fabrication facility.

The design of the EVC introduces an increased ability to customize the RF matching network for specific design needs of a particular application. EVCs may be configured with custom capacitance ranges, one example of which is a non-linear capacitance range. Such custom capacitance ranges can provide better impedance matching for a wider range of processes. As another example, a custom capacitance range may provide more resolution in certain areas of impedance matching. A custom capacitance range may also enable generation of higher ignition voltages for easier plasma strikes.

The short match tune process (~500 μsec or less) allows the RF impedance matching network to better keep up with plasma changes within the fabrication process, thereby increasing plasma stability and resulting in more controlled power to the fabrication process.

The use of EVCs, which are digitally controlled, non-mechanical devices, in an RF impedance matching network provides greater opportunity to fine tune control algorithms through programming.

EVCs exhibit superior low frequency (kHz) performance as compared to VVCs.

Balancing RF Voltages Across Series-Connected PIN Diodes

As discussed above, PIN diodes may be used as solid-state switches in RF matching networks, such as the matching networks shown in FIGS. 1-3. (The following will discuss PIN diodes, but a person of ordinary skill would understand that the discussion may also apply to NIP diodes.) As discussed above, an EVC may comprise fixed capacitors each having a switching circuit for switching in and out the fixed capacitor. For example, an EVC may utilize switching circuit 140A of FIG. 6. In this switching circuit 140A, the switch is a single PIN diode 161A.

Figure 9:
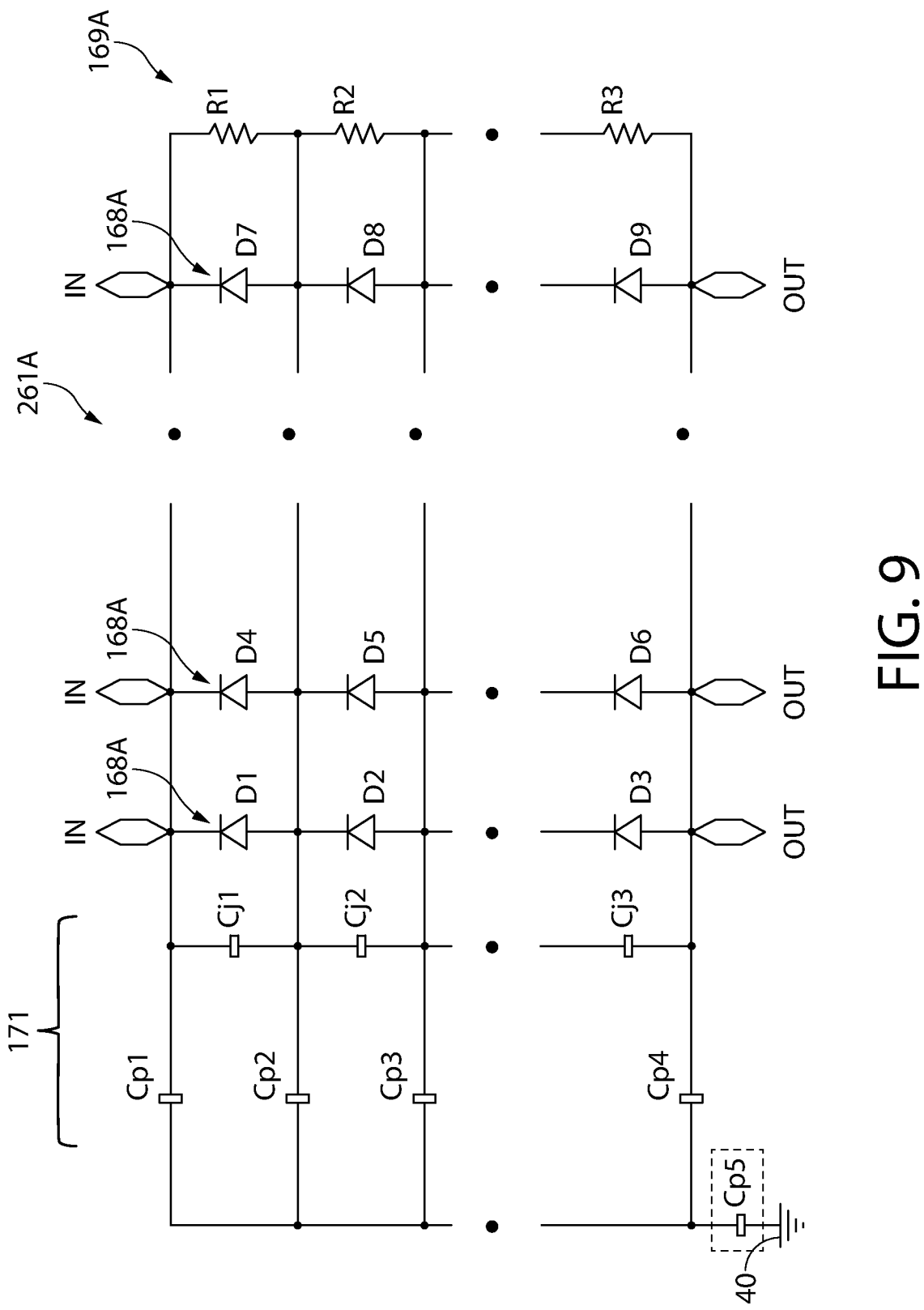
FIG. 9 is a diode-based switch utilizing balancing resistors according to one embodiment.

PIN diodes are effective RF switches because they have a very low leakage current and capacitance in the OFF state. These characteristics allow the PIN diode to look like an open circuit when in the OFF state. Some commercially-available PIN diodes have a maximum blocking voltage of several thousand volts. This maximum blocking voltage is commonly referred to as the reverse breakdown voltage. If this voltage is exceeded the device will avalanche and fail. This breakdown voltage limits the useful power range of the PIN diode. A PIN diode also has a maximum current rating in the ON state. This finite current rating also limits the maximum useful power range of the diode. To create a high-power RF switch using PIN diodes, multiple diodes may be placed in series and parallel. FIG. 9 provides an example of such a PIN diode array. Adding PIN diodes in series increases the maximum blocking voltage of the diode-based switch 261A, and connecting PIN diodes in parallel increases the overall current carrying capacity of the switch 261A. While adding PIN diodes in this manner will increase the overall voltage and current carrying capacity of the switch, it is further desirable that the diodes D1-D9 equally share the RF potential to effectively and efficiently avoid avalanching any one device.

The exemplified PIN diode switch is turned ON using a forward bias current. In high power applications, this current may be around 0.5 A. This forward bias current puts the PIN diode in a low resistance conduction state. In the OFF or blocking state, the exemplified PIN diodes receive a reverse voltage from cathode to anode that is greater than the peak RF potential of the circuit. This ensures the PIN diodes stay in the reverse bias state and do not forward conduct. When multiple PIN diodes are connected in series, it is desirable that the reverse blocking voltage is equally shared across each PIN diode. If the RF potential across one of the diodes exceeds the DC blocking voltage across that diode, then it will go into conduction mode.

Balance resistors may be used to balance the voltage across each PIN diode, see, e.g., balance resistors 169A (R1-R3) of FIG. 9. In the exemplified embodiment, the resistors are significantly lower than the leakage resistance across the PIN diode, but they are not too low in resistance or they will dissipate excessive power. In certain embodiments, the balance resistors are of the same value (e.g., 10 MΩ), though the invention is not so limited.

Figures 10, 18:
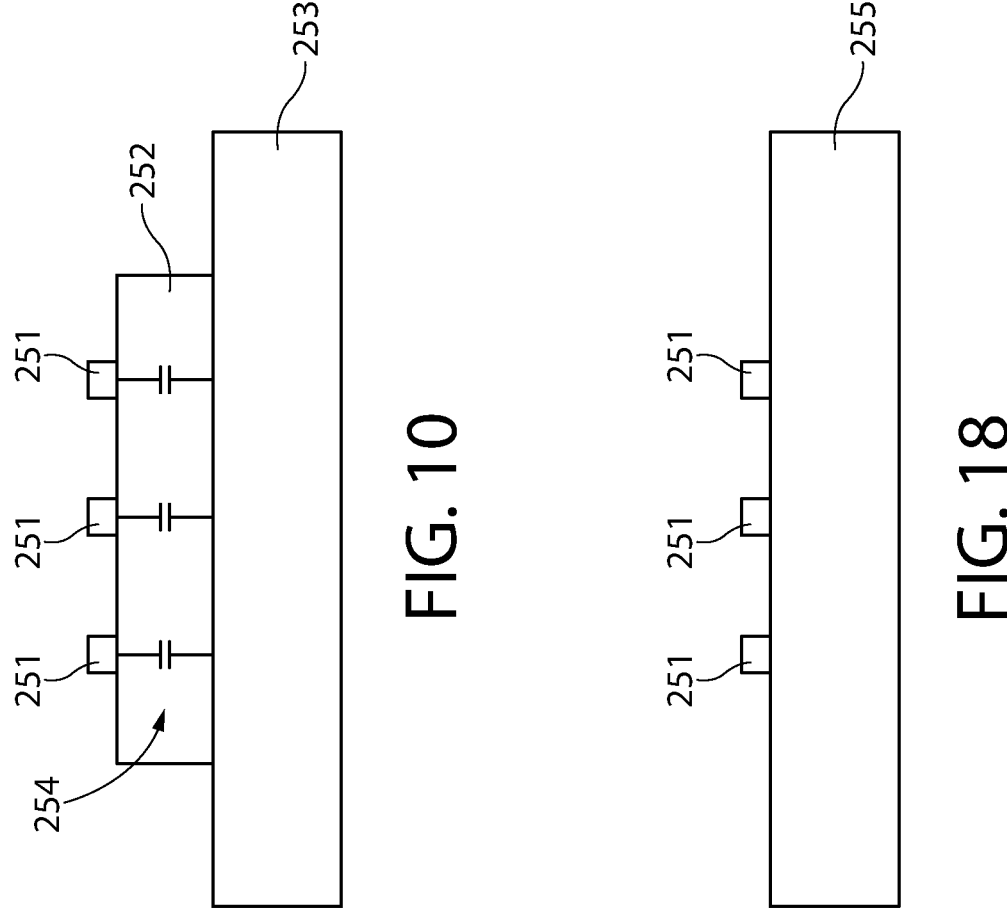
FIG. 10 is a block diagram of a diode-based switch positioned on a ceramic substrate, which is positioned on a metallic heat sink according to one embodiment.
FIG. 18 is a block diagram of a diode-based switch positioned on a ceramic heat sink according to another embodiment.

In high power applications, the PIN diodes often require cooling and use a heatsink to remove the heat. FIG. 10 shows one potential arrangement for removing heat. Specifically, FIG. 10 shows PIN diodes 251 mounted to (and potentially fabricated on) a substrate 252 that conducts heat but does not conduct electricity. The substrate may have copper traces to make the electrical connections. The substrate may be ceramic but is not so limited. Preferably, the substrate is an electrical insulator and an excellent conductor of heat. This allows the PIN diode to be electrically isolated from the package or heat sink but still have a low thermal impedance from junction to case. The substrate 252 is positioned on the heat sink 253. The substrate may be clamped to the heat sink, with thermal grease installed between them. The heat sink is typically grounded and made of a metallic, electrically-conducting material, though the invention is not so limited. As will be discussed in more detail below, parasitic capacitances 254 result between the PIN diodes 251 and the electrically-conductive heat 253.

The balancing resistors 169A in FIG. 9 may balance the DC blocking voltage but may not properly balance the RF voltage. At higher frequencies, the capacitive reactance of PIN diode junction capacitance can become equal to or less than the DC balance resistor value. At that point, the junction capacitance may become a dominant factor in the balance of the RF voltages across the series connected PIN diodes. Furthermore, when multiple PIN diodes are connected in series, the junction capacitance, and the capacitance from the die to ground create a voltage divider. This voltage divider affects the voltage division across the PIN diodes. As a result, this unequal voltage distribution limits the useful range of the series PIN diodes. FIG. 9 shows these parasitic capacitances 171. Cp1-4 are the capacitances from the die to the heat sink, and Cj1-3 are the capacitances from cathode to anode of the PIN diode in the OFF state.

In an ideal circumstance, the blocking voltage is equally divided across each of the PIN diodes. For example, if three diodes are used and the DC blocking voltage is 3 kV, then the blocking voltage would be equally divided such that there was 1 kV across each diode. The RF potential would also be equally divided.

Figure 11:
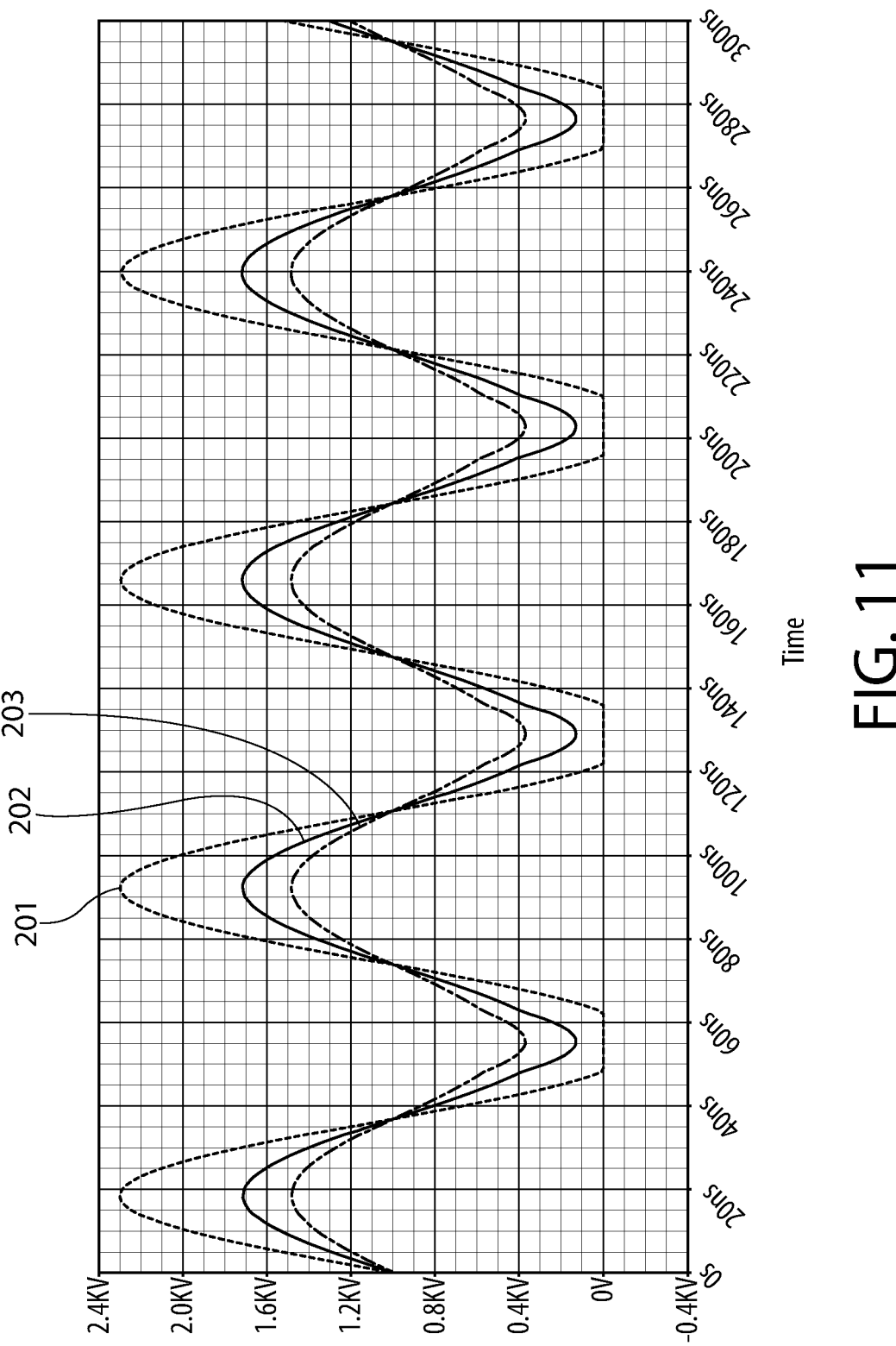
FIG. 11 is a graph of voltage across the diodes of the diode-based switch of FIG. 9.

FIG. 11 is a graph of voltage across the diodes of the diode-based switch of FIG. 9 based on a simulation. The model was used for a 3 kV, 17 A PIN diode. This diode has a junction capacitance of 2.2 pF, and 10 uA of leakage current at 3 kV. A 13 MHz frequency source was used with an amplitude of 2500V. A 3 kV DC blocking voltage was used.

FIG. 11's waveforms 201-203 show how the voltage across each PIN diode switch is affected by the parasitic capacitance from the die to ground. Waveform 201 shows the voltage across first diode D1. This diode D1 has the greatest RF voltage across it. Waveform 202 shows the voltage across second diode D2. This diode D2 has the second largest potential. Waveform 203 shows the voltage across third diode D3. This diode D3 has the least RF voltage across it. The voltage across D1 exceeds the 1 kV blocking voltage. As a result, D1 forward conducts during a portion of the sine wave.

Floating the Heat Sink

One way to eliminate the parasitic capacitance to ground is to remove the ground by floating the heat sink. In this case, the heat sink is acting as the ground. In this case, an additional parasitic capacitance Cp5 would be between the floating heat sink and circuit ground. This option is shown in FIG. 9 at parasitic capacitance Cp5.

Figure 12:
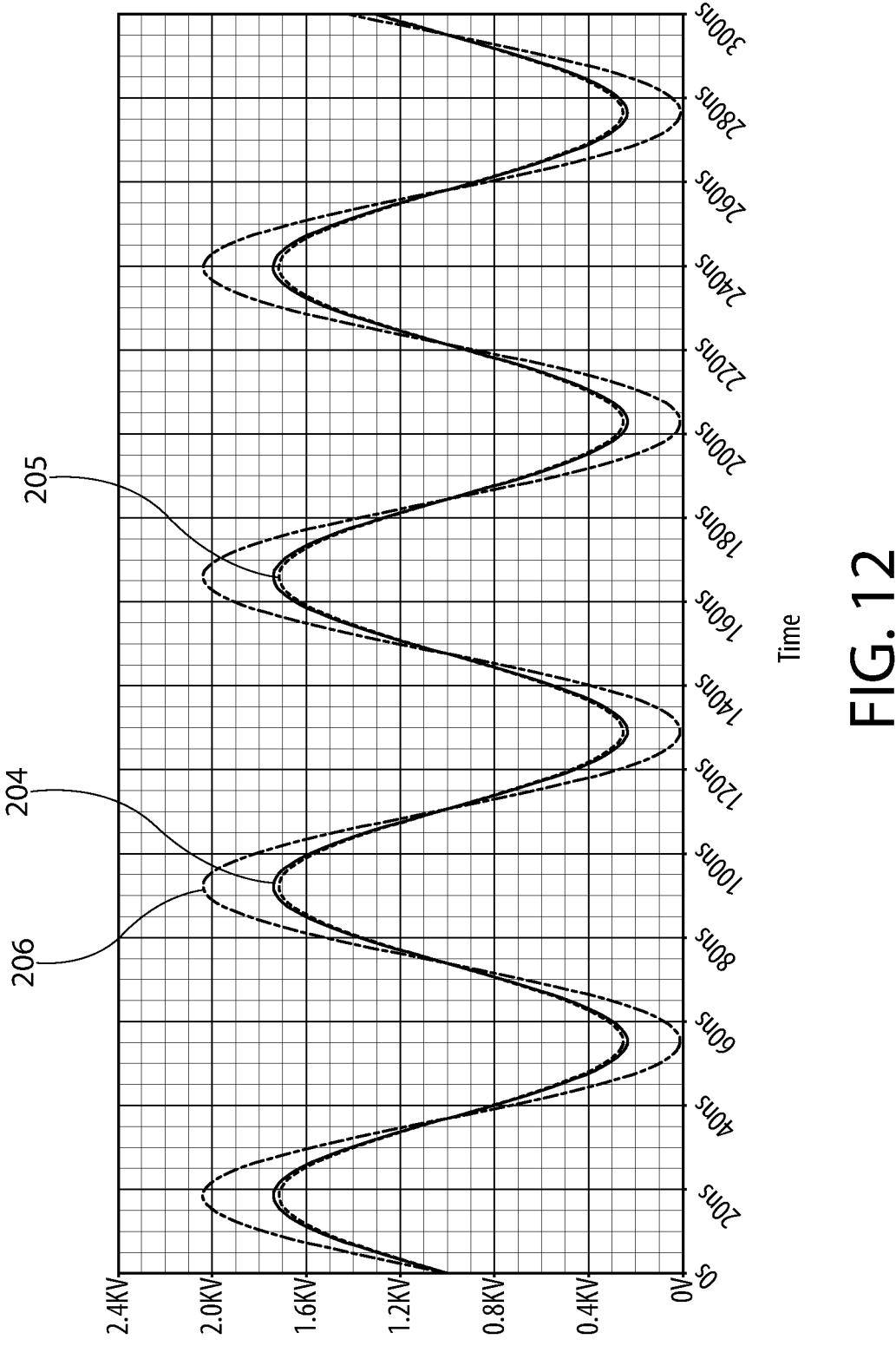
FIG. 12 is a graph of voltage across the diodes of the diode-based switch of FIG. 9 using a floating heat sink.

FIG. 12 is a graph of voltage across the diodes of the diode-based switch of FIG. 9 using a floating heat sink. For this simulation, a very small capacitance of 0.1 pF was used to model the capacitance from the heat sink to ground, and a very high resistance of 1000 MΩ was used to model the resistance from the heat sink to ground.

FIG. 12 shows that the voltages across the PIN diodes are not equal. Waveform 204 is the voltage across D1, waveform 205 is the voltage across D2, and waveform 206 is the voltage across D3. The voltages are not equal because the heatsink is acting like a floating ground plane. The parasitic capacitances from the PIN diodes to the floating ground are coupling to each other. These capacitances are not equal across each diode, so the voltages are not in balance. One possible solution to this problem is to use individual floating heat sinks for each PIN diode die. This would remove the common coupling path between the parasitic capacitances.

However, this approach may not be practical from a mechanical implementation standpoint because heat sinks can be large.

Unequal Balancing Resistors

Figure 13:
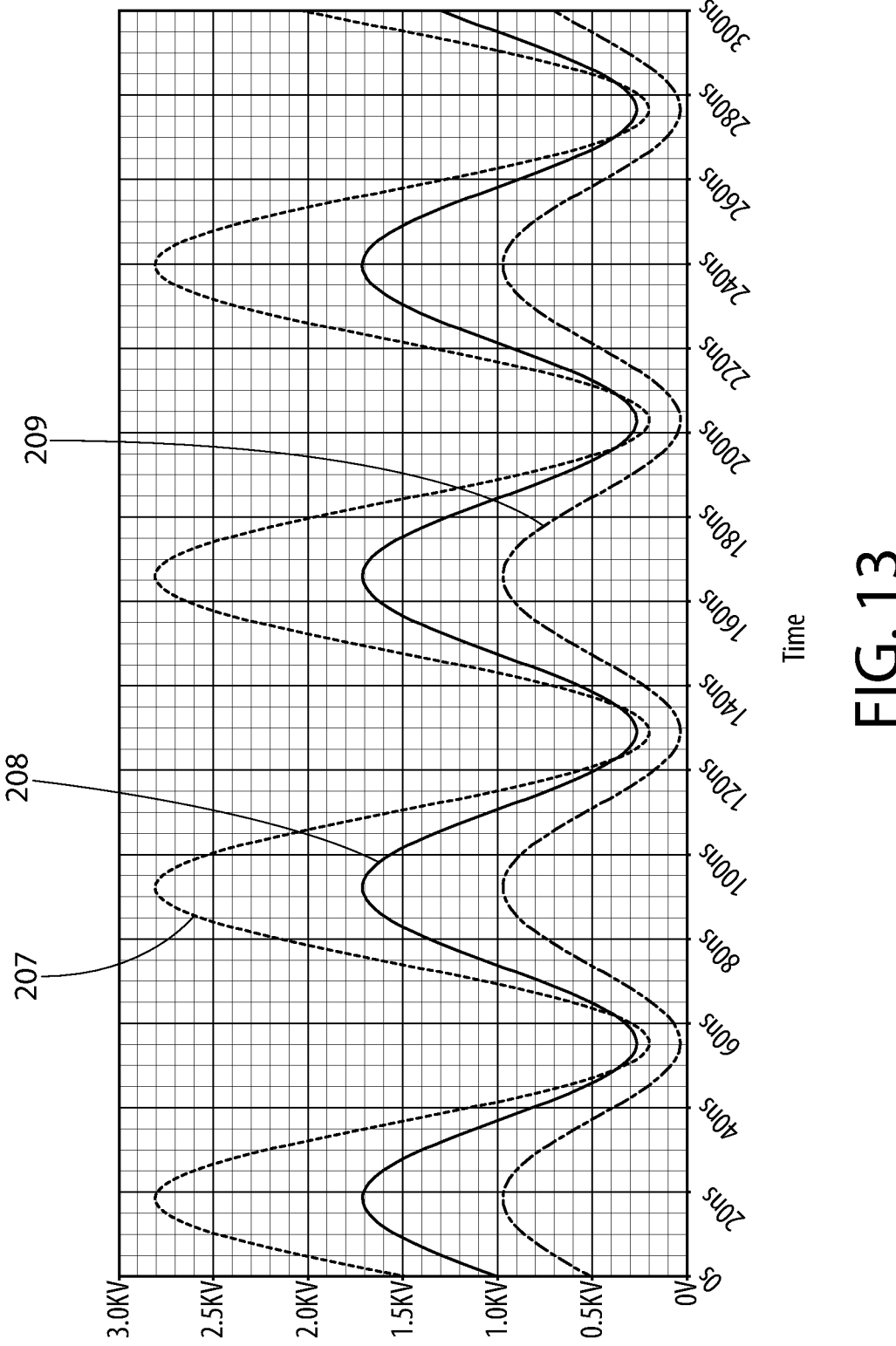
FIG. 13 is a graph of voltage across the diodes of the diode-based switch of FIG. 9 using balancing resistors of unequal value.

As shown in FIG. 11, the voltages across the PIN diodes are unequal and the diode with the largest voltage potential is forward conducting. This occurs because the DC blocking voltage is not greater than the RF potential across this diode. One solution to this problem is to use unequal values for the balancing resistors. In one embodiment, referring back to FIG. 9, R1 is 15 MΩ, R2 is 10 MΩ, and R3 is 5 MΩ. FIG. 13 shows the simulation result. Waveform 207 is the voltage across diode D1, waveform 208 is the voltage across diode D2, and waveform 209 is the voltage across diode D3. FIG. 13 shows the simulation result. The DC blocking voltages across each diode are proportional to the unequal RF potentials. The RF waveforms are centered around the DC offsets. All three diodes are now kept in the OFF state and do not forward conduct. However, if the RF potential across one of the diodes is greater than the reverse voltage rating of the diode, then the diode will still avalanche, which could destroy the device. This approach does not get the full voltage rating potential of the series-connected diodes insofar as it does not equally divide voltage across each diode.

Balancing Capacitors

Since the unequal voltage distribution is the result of a series of equal voltage dividers created by parasitic capacitances, one solution is to use lumped element or integral printed balancing capacitors to get the voltage across each diode back into balance. In one embodiment, the printed capacitors are be formed with copper traces on the substrate and use the dielectric constant of the substrate material, though the invention is not so limited.

Figure 14:
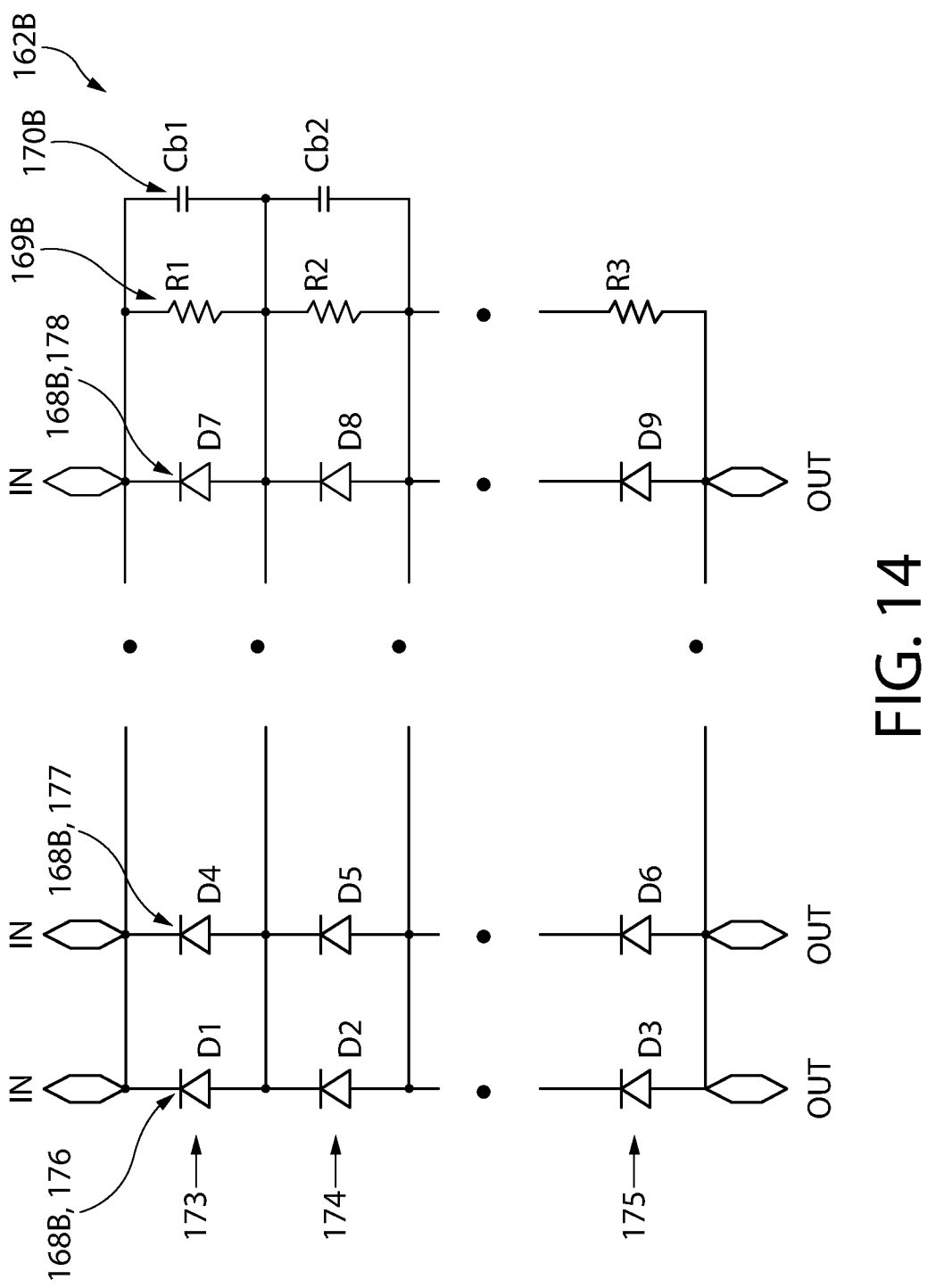
FIG. 14 is a diode-based switch utilizing balancing capacitors according to one embodiment.

FIG. 14 shows a diode-based switch 162B utilizing balancing capacitors 170B (Cb1, Cb2) according to one embodiment. As shown, a balancing capacitor Cb1, Cb2 was added across each of the first and second diodes 173, 174 of each string 168B to change the voltage division across them while in the OFF state. Though not shown, a balancing capacitor could also be added across the last diodes 175 in each string 168B. In the exemplified embodiment, the parasitic cathode-to-anode capacitance will be used for the last diode 175 (D3, D6, D9) instead of a capacitor. Further, in this embodiment the balancing resistors 169B are of equal value because the balancing capacitors 170B cause the RF potential to be equal across each diode, though the invention is not so limited. In other embodiments, the balancing resistors may be omitted.

In FIG. 14, the switch 162B is shown having strings 168B of series-connected diodes. Three strings 168B are shown, but in other embodiments there can be any number of strings. Each of the series-connected diodes is a PIN diode, but the diodes can alternatively be NIP diodes. For each string 168B, at least one of the diodes has a balancing capacitor 170B parallel to the diode. In this example, the first diodes 173 in each string are parallel to balancing capacitor Cb1, and the second capacitors 174 in each string are parallel to balancing capacitor Cb2. The third diodes 175 do have a parallel balancing capacitors, though in other embodiments these diodes 175 may have a balancing capacitor.

In the exemplified embodiment, the diodes of the strings 168B are arranged in an array such that a first diode D1 of a first string 176 is parallel to first diodes D4, D7 of each of the other strings 177, 178, and a second diode D2 of the first string 176 is coupled parallel to second diodes D5, D6 of each of the other strings. Further, the first diodes 173 of each of the strings 168B share a common first balancing capacitor Cb1, and the second diodes 174 of each string 168B share a common second balancing capacitor Cb2. Further, in this embodiment the first diodes 173 of each of the strings 168B, share a common first balancing resistor R1 coupled parallel to the first diodes 173, and the second diodes 174 of each string 168B share a common second balancing resistor R2 coupled parallel to the second diodes 174.

The values of the balancing capacitors may differ or may be the same. These values may be chosen by a variety of methods, and may depend on the specific switch being used, the values of the diodes, the values of the anticipated parasitic capacitances, the values of the resistors, etc. While methods may be used to calculate values for the capacitance values, one may alternately use trial and error to determine the capacitance values most effective to enable the voltages across to be equally divided (or close to equally divided) across each diode.

Figure 15:
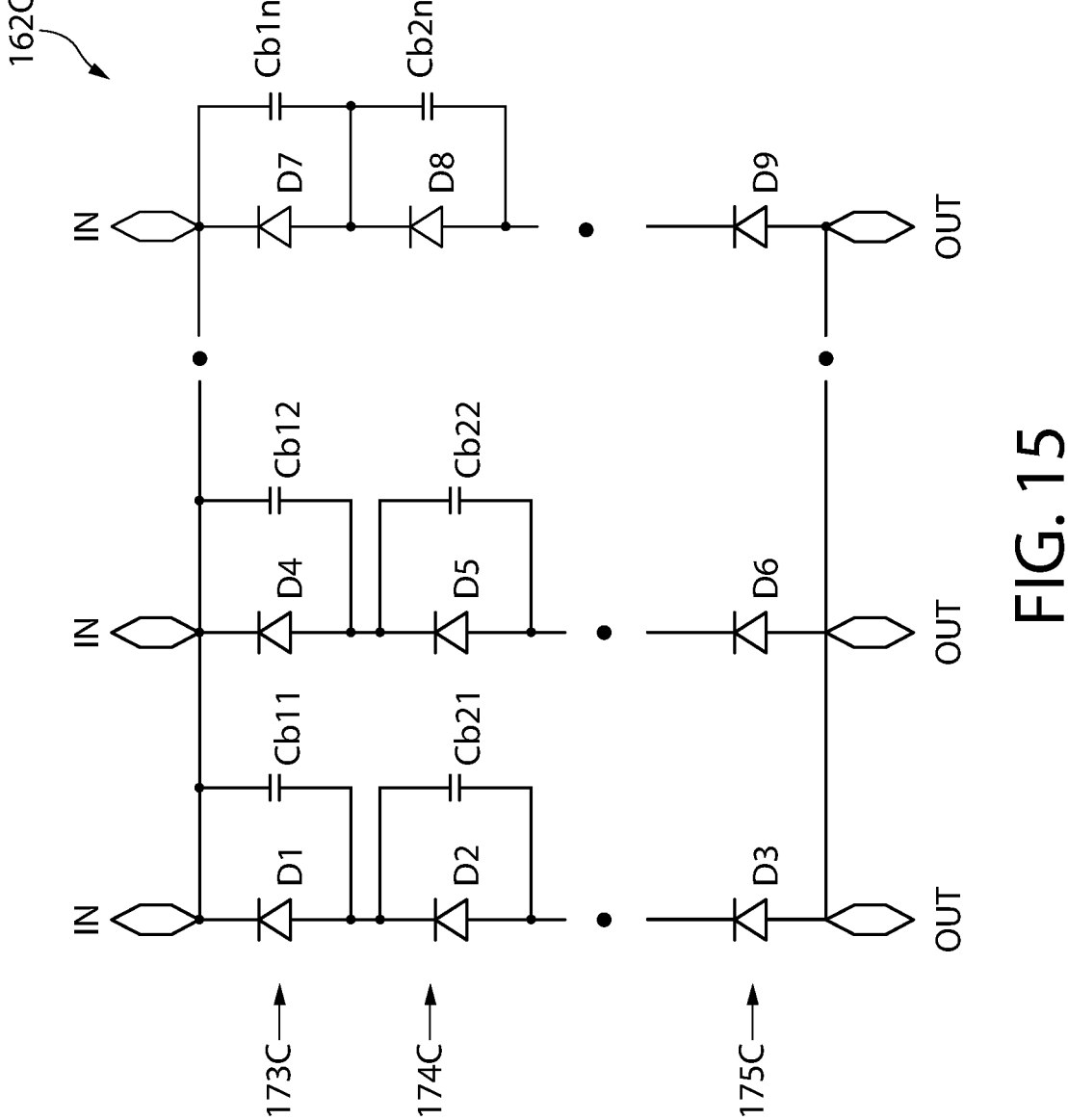
FIG. 15 is a diode-based switch utilizing balancing capacitors according to another embodiment.

FIG. 15 shows an alternative configuration for utilizing balancing capacitors in a diode-based switch 162C. This configuration is the same as FIG. 14, except the diodes in a given row of the array (e.g., the first diodes 173C (D1, D4, D7) are not coupled in parallel with one another. In this event, rather than having a balancing capacitor (e.g., Cb1) parallel to each row (e.g., first diodes 173C), there is a separate balancing capacitor parallel to each diode of the first and second diode rows 173C, 174C. In this embodiment, the last row of diodes 175C has no balancing capacitor. In other embodiments, the diodes of the last row may also have their own balancing capacitors. Put differently, diode D1 has balancing capacitor Cb11, diode D2 has balancing capacitor Cb21, diode D4 has balancing capacitor Cb12, diode D5 has balancing capacitor Cb22, diode D7 has balancing capacitor Cb1n, and diode D2 has balancing capacitor Cb2n. Balancing resistor are omitted in this figure, but may be included similar to FIG. 14.

Figure 16:
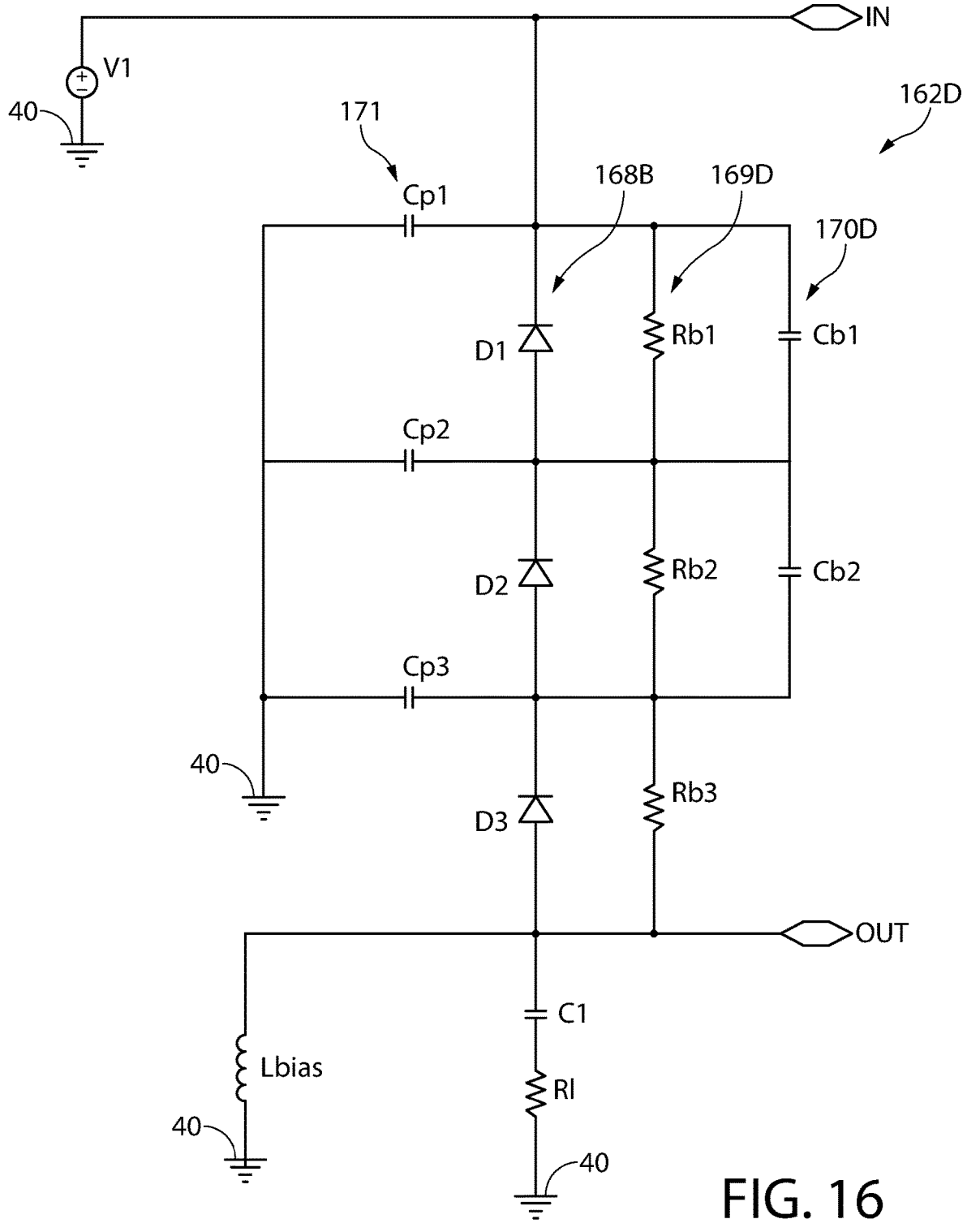
FIG. 16 is a simulation schematic for a diode-based switch utilizing balancing capacitors according to one embodiment.

FIG. 16 below is a simulation schematic for a diode-based switch 162D utilizing balancing capacitors and resistors in an array similar to FIG. 14. For diodes D1, D2, D3, the simulation used a 3 kV, 17A PIN diode having a junction capacitance of 2.2 pF and 10 uA of leakage current at 3 kV. A 13 MHz frequency source V1 (coupled to ground 40) was used with an amplitude of 2500V. A 3 kV DC blocking voltage was used. Note that the simulation schematic of FIG. 16 is simplified. The voltage source V1 may also contain a DC offset voltage (e.g., 3 kV). The DC offset voltage may be used to simulate the blocking voltage that is typically fed to the cathode of the PIN diode through a choke. This choke may also be used to alternatively feed the forward bias voltage (e.g., −5V) when the switch is on.

A single first string 168D of PIN diodes D1, D2, D3 is used, which have corresponding balancing resistors 169D (Rb1, Rb2, Rb3) to evenly distribute the 3 kV blocking voltage. In this simulation, each of the balancing resistors 169D has a resistance of 10 MΩ. The first two diodes D1, D2 have corresponding balancing capacitors 170D. Balancing capacitor Cb1 has capacitance of 3 pF and balancing capacitor Cb2 has a capacitance of 1 pF. The parasitic capacitances 171 are also represented, being Cp1, Cp2, and Cp3, respectively. Biasing inductor Lbias (1 m) was used as an RF choke. It has a high impedance at the operating frequency, which provides a DC return path for the DC blocking voltage and forward bias voltage. Further, DC blocking capacitor C1 was used to allow the RF to pass but blocks the DC blocking voltage. Resistor R1 (10 MΩ) is an RF load.

Figure 17:
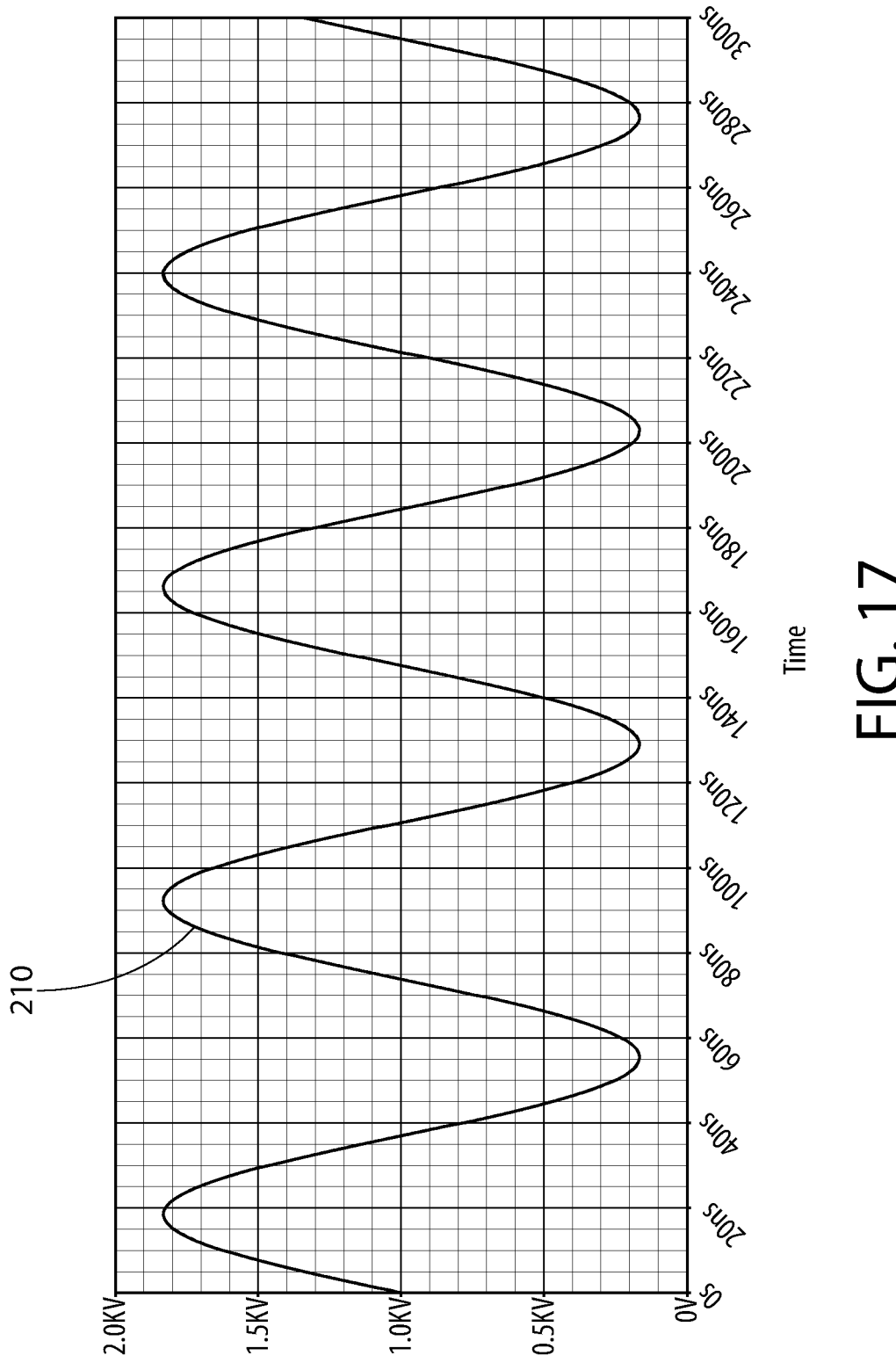
FIG. 17 is a graph of voltage across the diodes of the diode-based switch of FIG. 15 utilizing balancing capacitors according to one embodiment.

FIG. 17 is a graph of voltage across the diodes of the diode-based switch of FIG. 15 utilizing balancing capacitors according to one embodiment. As may be observed, the RF potentials are balanced, with the voltage across each diode being represented by waveform 210.

As discussed above, the diode-based switches discussed herein may be incorporated into an EVC used in an RF matching network. Such a matching network for matching impedance may be utilized in a semiconductor processing tool. Such a matching network may also be utilized in a method of impedance matching, and/or in a method of fabricating a semiconductor that includes impedance matching.

Non-Electrically-Conducting Heatsink

As discussed above with regard to FIG. 10, use of a metallic heat sink that conducts electricity can lead to parasitic capacitances 254 that cause the RF potentials across the diode of a diode-based switch to be imbalanced. The above solution uses balancing capacitors to address this issue and balance the RF potentials.

Another approach to keeping the RF potential across the diodes balanced is to use a non-electrically-conducting heat sink, as shown in FIG. 18. According to this approach, the heat sink 255 is made from a thermally conducting but electrically insulating material. The diodes 251 of the diode-based switch are positioned directly on the non-conducting heat sink, as opposed to being positioned on a non-conducting substrate that is positioned on a conducting heat sink. In certain embodiments, the heat sink comprises or is made from a ceramic material, such as beryllium oxide (BeO), aluminum nitride (AlN), or alumina ceramic (Al2O3). Such materials are effective conductors of heat, and also effective electrical insulators. There are also a number of composite materials that may be used in place of ceramic. The heat sink may be air or water cooled.

Once the electrically conductive property of the heat sink is removed, the circuit schematic is similar to that of FIG. 9, but without the parasitic capacitances 171. Accordingly, the RF potentials are equally balanced across the diodes 251, 168A.

As discussed above with regard to FIG. 10, when a PIN diode array is fabricated on a non-electrically-conducting substrate, the substrate may have copper traces on it to make the electrical connections. The parts may be soldered to the substrate. If the substrate is attached to an electrically-conducting heat sink, the substrate may then be clamped to the heat sink, and thermal grease may be installed between them. The grease, however, adds extra thermal impedance to the assembly and raises the temperature of the components mounted to it. By eliminating the electrically-conducting heat sink, the substrate clamps and the thermal grease may eliminated to make the non-electrically conducting heat sink and the circuit ceramic substrate into one homogenous piece. According to this embodiment, circuit can be fabricated right on top of the ceramic heat sink.

It is noted that, in addition to eliminating (or reducing) voltage imbalance across the diodes of the switch, the non-conducting heat sink of FIG. 18 may provide another advantage. In an L-type match (such as that shown in FIG. 2), the parasitic capacitance to ground from the series output capacitor (see, e.g., series capacitor 31 of FIG. 2) may be a problem, as this capacitance may limit the matching network range. As discussed herein, parasitic capacitance may be created when placing the switching circuit on a ceramic substrate that is in turn clamped to a grounded conducting heatsink. This is particularly evident in higher frequencies where the reactance of this parasitic capacitance becomes lower. By mounting the cap array on a ceramic heatsink, the parasitic capacitance may be eliminated, thus increasing the tuning range. Alternatively, the conducting heatsink could be floated.

While the embodiments of a matching network discussed herein have used L or pi configurations, it is noted that the claimed matching network may be configured in other matching network configurations, such as a 'T' type configuration. Unless stated otherwise, the variable capacitors, switching circuits, and methods discussed herein may be used with any configuration appropriate for an RF impedance matching network.

While the embodiments discussed herein use one or more variable capacitors in a matching network to achieve an impedance match, it is noted that any variable reactance element can be used. A variable reactance element can include one or more discrete reactance elements, where a reactance element is a capacitor or inductor or similar reactive device.

This application incorporates by reference in its entirety commonly-owned U.S. Pat. No. 10,460,912, U.S. Pub. No. US2021/0327684, U.S. Pub. No. US2021/0327684, and U.S. Pat. No. 10,984,985.

While the inventions have been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present inventions. Thus, the spirit and scope of the inventions should be construed broadly as set forth in the appended claims.

What is claimed is:

1. A radio frequency (RF) impedance matching circuit comprising:

an RF input configured to operably couple to an RF source providing an RF signal;

an RF output configured to operably couple to a plasma chamber;

at least one electronically variable capacitor (EVC), wherein each EVC of the at least one EVC comprises fixed capacitors, each of the fixed capacitors having a corresponding switching circuit for switching in and out the fixed capacitor to alter a total capacitance of the EVC; and a control circuit configured to cause the switching in and out of the fixed capacitors of each EVC to enable an impedance match;

wherein each switching circuit for each fixed capacitor of each EVC comprises:

a switch operably coupled to the fixed capacitor to cause the switching in and out of the fixed capacitor, the switch comprising at least two strings of series-connected diodes, each of the diodes of the series-connected diodes being a PIN diode or an NIP diode;

wherein the diodes of the at least two strings are arranged in an array such that a first diode of a first string is parallel to first diodes of each of the other strings, and a second diode of the first string is coupled parallel to second diodes of each of the other strings; and wherein the first diodes of each of the at least two strings shares a common first balancing capacitor.

2. The impedance matching circuit of claim 1:

wherein the second diodes of each of the strings shares a common second balancing capacitor.

3. The impedance matching circuit of claim 2 wherein the first diodes of each of the strings share a common first balancing resistor coupled parallel to the first diodes, and the second diodes of each of the strings share a common second balancing resistor coupled parallel to the second diodes.

4. The impedance matching circuit of claim 3 wherein the first and second balancing resistors have equal resistance values.

5. The impedance matching circuit of claim 2 wherein the first balancing capacitor has a capacitance value different from a capacitance value of the second balancing capacitor.

6. The impedance matching circuit of claim 1 wherein each of the series-connected diodes is positioned on a substrate that conducts heat but does not conduct electricity, the substrate being positioned on a heat sink that conducts electricity.

7. The impedance matching circuit of claim 6 wherein the substrate comprises a ceramic material.

8. The impedance matching circuit of claim 1 wherein the value of each balancing capacitor is based on the anticipated value of one or more parasitic capacitances in the switching circuit when the balancing capacitors are not present.

9. A method of matching an impedance comprising:

coupling a radio frequency (RF) input of a matching circuit to an RF source providing an RF signal;

coupling an RF output of the matching circuit to a plasma chamber, wherein the matching circuit comprises:

at least one electronically variable capacitor (EVC), wherein each EVC of the at least one EVC comprises fixed capacitors, each of the fixed capacitors having a corresponding switching circuit for switching in and out the fixed capacitor to alter a total capacitance of the EVC; and a control circuit configured to cause the switching in and out of the fixed capacitors of each EVC to enable an impedance match;

wherein each switching circuit for each fixed capacitor of each EVC comprises:

a switch operably coupled to the fixed capacitor to cause the switching in and out of the fixed capacitor, the switch comprising at least two strings of series-connected diodes, each of the diodes of the series-connected diodes being a PIN diode or an NIP diode wherein the diodes of the at least two strings are arranged in an array such that a first diode of a first string is parallel to first diodes of each of the other strings, and a second diode of the first string is coupled parallel to second diodes of each of the other strings; and wherein the first diodes of each of the at least two strings shares a common first balancing capacitor; and matching an impedance by at least one of the switching circuits of the at least one EVC switching in or out its corresponding fixed capacitor to alter a total capacitance of the EVC.

10. The method of claim 9:

wherein the second diodes of each of the strings shares a common second balancing capacitor.

11. The method of claim 10 wherein the first diodes of each of the strings share a common first balancing resistor coupled parallel to the first diodes, and the second diodes of each of the strings share a common second balancing resistor coupled parallel to the second diodes.

12. The method of claim 11 wherein the first and second balancing resistors have equal resistance values.

13. The method of claim 10 wherein the first balancing capacitor has a capacitance value different from a capacitance value of the second balancing capacitor.

14. The method of any of claim 9 wherein each of the series-connected diodes is positioned on a substrate that conducts heat but does not conduct electricity, the substrate being positioned on a heat sink that conducts electricity.

15. The method of claim 14 wherein the substrate comprises a ceramic material.

16. The method of claim 9 wherein the value of each balancing capacitor is based on the anticipated value of one or more parasitic capacitances in the switching circuit when the balancing capacitors are not present.

17. A semiconductor processing tool comprising:

a plasma chamber configured to deposit a material onto a substrate or etch a material from the substrate; and an impedance matching circuit operably coupled to the plasma chamber, the matching circuit comprising:

an RF input configured to operably couple to an RF source providing an RF signal;

an RF output configured to operably couple to the plasma chamber;

at least one electronically variable capacitor (EVC), wherein each EVC of the at least one EVC comprises fixed capacitors, each of the fixed capacitors having a corresponding switching circuit for switching in and out the fixed capacitor to alter a total capacitance of the EVC; and a control circuit configured to cause the switching in and out of the fixed capacitors of each EVC to enable an impedance match;

wherein each switching circuit for each fixed capacitor of each EVC comprises:

a switch operably coupled to the fixed capacitor to cause the switching in and out of the fixed capacitor, the switch comprising at least two strings of series-connected diodes, each of the diodes of the series-connected diodes being a PIN diode or an NIP diode;

wherein the diodes of the at least two strings are arranged in an array such that a first diode of a first string is parallel to first diodes of each of the other strings, and a second diode of the first string is coupled parallel to second diodes of each of the other strings; and wherein the first diodes of each of the at least two strings shares a common first balancing capacitor.

* * * * *